US010788537B2

(12) United States Patent
Vidal

(10) Patent No.: US 10,788,537 B2
(45) Date of Patent: Sep. 29, 2020

(54) MODULAR SYSTEM FOR MONITORING BATTERIES

(71) Applicant: ID3D TECHNOLOGIES INC., Saint-Denis-de-Brompton (CA)

(72) Inventor: Marc Vidal, Saint-Denis-de-Brompton (CA)

(73) Assignee: ID3D Technologies inc., Saint-Denis-de-Brompton (CA)

( * ) Notice: Subject to any disclaimer, the term of this patent is extended or adjusted under 35 U.S.C. 154(b) by 145 days.

(21) Appl. No.: 15/750,079

(22) PCT Filed: Aug. 3, 2016

(86) PCT No.: PCT/CA2016/050910
§ 371 (c)(1),
(2) Date: Feb. 2, 2018

(87) PCT Pub. No.: WO2017/020129
PCT Pub. Date: Feb. 9, 2017

(65) Prior Publication Data
US 2018/0231614 A1  Aug. 16, 2018

Related U.S. Application Data

(60) Provisional application No. 62/201,162, filed on Aug. 5, 2015.

(51) Int. Cl.
*G01R 31/3842* (2019.01)
*G01R 31/396* (2019.01)
(Continued)

(52) U.S. Cl.
CPC ....... *G01R 31/3842* (2019.01); *G01R 31/396* (2019.01); *G06F 1/26* (2013.01);
(Continued)

(58) Field of Classification Search
None
See application file for complete search history.

(56) References Cited

U.S. PATENT DOCUMENTS 3,443,115 A   5/1969  Timmerman, Jr.
4,025,860 A   5/1977  Shibata et al.
(Continued)

FOREIGN PATENT DOCUMENTS

CN   202487712 U  * 10/2012
CN   104009520     8/2014
WO   2014013314    1/2014

OTHER PUBLICATIONS

Chatzakis, et al. "Designing a New Generalized Battery Management System". IEEE Transactions on Industrial Electronics, vol. 50, No. 5, Oct. 2003.
(Continued)

*Primary Examiner* — John C Kuan
(74) *Attorney, Agent, or Firm* — Benoit & Cote, Inc.; C. Marc Benoit; Charles-André Caron

(57) ABSTRACT

There is described a dissociating module for monitoring an object and managing electric input into and output from the object, the object being a battery or a load. The dissociating module is for use with at least one other dissociating module. The dissociating module comprises: measuring devices for taking measurements of the object; a microcontroller operatively connected to the measuring devices for receiving the measurements of the objects, and for operative connection to a microcontroller of the at least one other dissociating module for receiving information therefrom; and switches, operatively connected to the microcontroller. The microcontroller, based on at least one of the measurements of the object received and the information received from the at least one other dissociating module, controls
(Continued)

opening and closing of the switches for controlling electrical current in the dissociating module.

20 Claims, 15 Drawing Sheets

(51) Int. Cl.
    *G06F 1/26*         (2006.01)
    *H02J 7/00*        (2006.01)
    *G01R 31/364*    (2019.01)
    *H01M 10/42*     (2006.01)
    *H01M 10/44*     (2006.01)

(52) U.S. Cl.
    CPC .......... *H02J 7/0024* (2013.01); *H02J 7/0031* (2013.01); *H02J 7/0047* (2013.01); *G01R 31/364* (2019.01); *H01M 10/4257* (2013.01); *H01M 10/441* (2013.01); *H02J 7/0048* (2020.01); *H02J 7/0049* (2020.01)

(56) References Cited

U.S. PATENT DOCUMENTS

| | | | |
|---|---|---|---|
| 4,056,764 | A | 11/1977 | Endo et al. |
| 6,104,967 | A | 8/2000 | Hagen et al. |
| 7,020,790 | B2 | 3/2006 | Mares |
| 8,237,400 | B2 | 8/2012 | Gamboa et al. |
| 8,324,865 | B1* | 12/2012 | Cohen .................. H02J 7/0047 320/132 |
| 8,406,936 | B1 | 5/2013 | Borumand et al. |
| 2004/0027094 | A1 | 2/2004 | Sanders |
| 2005/0038614 | A1 | 2/2005 | Botts et al. |
| 2006/0092583 | A1 | 5/2006 | Alahmad et al. |
| 2007/0182576 | A1 | 8/2007 | Proska et al. |
| 2007/0285056 | A1* | 12/2007 | Yoon ....................... G06F 1/263 320/116 |
| 2009/0045770 | A1* | 2/2009 | Lin .......................... H02J 7/35 320/101 |
| 2009/0146610 | A1* | 6/2009 | Trigiani ................ H02J 7/0018 320/119 |
| 2010/0237828 | A1* | 9/2010 | Maegawa ............. H02J 7/0018 320/118 |
| 2010/0261048 | A1 | 10/2010 | Kim et al. |
| 2010/0264739 | A1 | 10/2010 | Errington |
| 2011/0050000 | A1* | 3/2011 | Park ...................... H02J 7/0047 307/116 |
| 2011/0109275 | A1 | 5/2011 | Keitaro |
| 2012/0319658 | A1 | 12/2012 | White et al. |
| 2013/0110428 | A1* | 5/2013 | Sun ..................... G01R 31/3835 702/63 |
| 2013/0154567 | A1 | 6/2013 | Peterson et al. |
| 2013/0229150 | A1* | 9/2013 | Eoka .................... H02J 7/0042 320/112 |
| 2013/0270905 | A1* | 10/2013 | Feuerstack ............. H02P 27/14 307/18 |
| 2014/0062413 | A1 | 3/2014 | Kim |
| 2014/0312831 | A1 | 10/2014 | Lewis et al. |
| 2015/0061687 | A1 | 3/2015 | Shim |
| 2015/0188334 | A1 | 7/2015 | Dao et al. |
| 2015/0340884 | A1* | 11/2015 | Suzuki ..................... B60L 7/12 320/107 |
| 2015/0380959 | A1 | 12/2015 | Chang et al. |
| 2016/0118819 | A1* | 4/2016 | Chatroux ............. H02J 7/0019 320/112 |
| 2016/0121737 | A1* | 5/2016 | Henningson .......... H02J 7/0047 320/109 |
| 2016/0276854 | A1* | 9/2016 | Lian ........................ B60L 58/10 |

OTHER PUBLICATIONS

Byrne, et al. "Behaviour of Systems Mixing Parallel Strings of Lithium-Ion and Lead-Acid Batteries for Telecommunications Applications". 2000. DMTS, Tyco Electronics Power Systems, USA.

Z. C. Feng and Yuwen Zhang "Thermal runaway due to symmetry breaking in parallelconnected battery cells". 2013. Department of Mechanical and Aerospace Engineering, University of Missouri, Columbia, MO 65211, USA.

Yann Riffonneau, et al. "Optimal Power Flow Management for Grid Connected PV Systems With Batteries". IEEE Transactions on Sustainable Energy, vol. 2, No. 3, Jul. 2011.

Bogart Engineering, "PentaMetric System". Jun. 2011.

Chia, et al. "A load predictive energy management system for supercapacitor-battery hybrid energy storage system in solar application using the Support Vector Machine". Department of Electrical and Electronic Engineering, University of Nottingham, Malaysia Campus, Malaysia and Faculty of Integrative Sciences and Technology, Quest International University Perak, Malaysia, (2015).

Bo Dong, et al. "Parallel Architecture for Battery Charge Equalization". IEEE Transactions on Power Electronics, vol. 30, No. 9, Sep. 2015.

Virulkar, et al. "Integrated battery controller for distributed energy system". 2011. Visvesvaraya National Institute of Technology, Electrical Engineering Department, Nagpur, MS, India b University College London, UCL School of Energy and Resources and International Energy Policy Institute, Torrens Building, 220 Victoria Square, Adelaide, SA 5000, Australia.

"Wireless Battery Management System" in Patent Application Approval Process by VerticalNews correspondents. 2015. Telecommunications Weekly.

Saha, et al. "Comparison of prognostic algorithms for estimating remaining useful life of batteries". Transactions of the Institute of Measurement and Control 31, 3/4 (2009) pp. 293-308.

"Channel Active Cell Balance Battery Management Reference Design" TI Designs, TIDA-00239 (2014).

Rosolem, et al. "Stationary Lead-Acid Batteries Maintenance Management System". Light Centrais Elétricas S. A Av. Marechal Floriano, 168—4° andar—Centro—CEP 20080-002 Rio de Janeiro—RJ, Brazil and CPqD Foundation—Telecommunications Research and Development Center Rod. Campinas—Mogi-Mirim km 118. 5—CEP: 13086-902 Campinas—SP, Brazil, IEEE (2010).

Rong-Jong Wai, et al. "Intelligent Optimal Energy Management System for Hybrid Power Sources Including Fuel Cell and Battery". IEEE Transactions on Power Electronics, vol. 28, No. 7, Jul. 2013.

Peter Korenčiak, "Charge Controller for Solar Panel Based Charging of Lead-Acid Batteries". (2011). BRNO University of Technology.

New product news: Battery management system scales from 12 KW to full 2 mW (2014). American P sychological Association, 6th Edition. Chatham: Newstex. Retrieved from http://ezproxy.usherbrooke.ca/login?url=http://search.proquest.com/docview/1642351302?accountid=13835.

Nalin A. Chaturvedi, et al. "Algorithms for advanced BMS", 'Modeling, Estimation, and Control Challenges for Lithium-Ion Batteries'. (Jun. 2010). IEEE Control Systems Magazine.

Moo, et al. "Parallel Operation of Battery Power Modules". IEEE Transactions on Energy Conversion, vol. 23, No. 2, Jun. 2008.

Mid-Eum Choi, et al. "Real-Time Optimization for Power Management Systems of a Battery/Supercapacitor Hybrid Energy Storage System in Electric Vehicles". Oct. 8, 2014, IEEE Transactions on Vehicular Technology, vol. 63, No. 8.

M. Conte, et. al. "Hybrid battery-supercapacitor storage for an electric forklift: a life-cycle cost assessment". Italian National Agency for New Technologies, Energy and Sustainable Economic Development (ENEA), Via Anguillarese, 301, 00123 Rome, Italy, J Appl Electrochem (2014).

Kularatna, et al. "Rechargable batteries and battery management systems design". 2010. School of Engineering , The University of Waikato, Hamilton, New Zealand.

Kaiser, Rudi et al., "Optimized battery-management system to improve storage lifetime in renewable energy systems". 2006. Journal of Power Sources 168 (2007) 58-65.

Radu Gogoana, et al. "Internal resistance matching for parallel-connected lithium-ion cells and impacts on battery pack cycle life". Journal of Power Sources 252 (2014) 8e13.

Jossen, et al. "Reliable battery operation—a challenge for the battery management system". Jun. 28, 1999. Center for Solar

(56) References Cited

OTHER PUBLICATIONS

Energy and Hydrogen Research Baden-Wuerttemberg, Difision for Electrochemical Energy Storage and Energy Conlersion, Helmholtzstrasse 8, D-89081 Ulm, Germany.

Hsu, et al. "Increased Energy Delivery for Parallel Battery Packs with No Regulated Bus". 2012. Department of Electrical and Computer Engineering, Northeastern University 360 Huntington Ave., Boston, MA 02115.

Hsu, et al. "Balancing Charge/Discharge Management for Series/Parallel Battery Packs". 2011. ational Science Council, Taiwan under the Grant NSC 100-2221-E-005-026.

Tredeau, Frank "Battery Evaluation and Battery Management System". 2011. The Faculty of the Department of Electrical and Computer Engineering in Partial Fulfillment of the Requirements.

Energy research; findings on energy research reported by investigators at shandong university (A LiFePO4 battery pack capacity estimation approach considering in-parallel cell safety in electric vehicles). (2015). Energy Weekly News, 407. Retrieved from http://ezproxy.usherbrooke.ca/login?url=http://search.proquest.com/docview/1673178341?accountid=13835.

Wang, et al., "The Stand-alone PV Generation System with Parallel Battery Charger". 2010. International Conference on Electrical and Control Engineering.

Xianzhi Gong, et al. "Study of the Characteristics of Battery Packs in Electric Vehicles With Parallel-Connected Lithium-Ion Battery Cells". IEEE Transactions on Industry Applications, vol. 51, No. 2, Mar./Apr. 2015.

Xiong, et al. "Optimal energy management for a series-parallel hybrid electric bus". Institute of Automotive Engineering, Shanghai Jiao Tong University, Room 308, 800 Dongchuan Road, Shanghai 200240, PR China, Energy Conversion and Management 50 (2009) 1730-1738.

Elsayed, Ahmed T., et al. "Advanced Battery Management and Diagnostic System for Smart Grid Infrastructure". 2015. IEEE Transactions on Smart Grid. See http://www.ieee.org/publications_standards/publications/rights/index.html for more information.

Choi, et al. "Energy Management Optimization in a Battery/Supercapacitor Hybrid Energy Storage System". IEEE Transactions on Smart Grid, vol. 3, No. 1, Mar. 2012.

Zhang, et al. "New Lead-Acid Battery Management System Based on Generator Regulation". International Journal of Automotive Technology, vol. 13, No. 4, pp. 679-686 (2012) DOI 10.1007/s12239-012-0066-8.

Zhou, et al. "Composite Energy Storage System Involving Battery and Ultracapacitor With Dynamic Energy Management in Microgrid Applications". IEEE Transactions on Power Electronics, vol. 26, No. 3, Mar. 2011.

Chiang, et al. "Multi-Module Parallel Small Battery Energy Storage System". EEE Transactions on Energy Conversion, vol. 11, No. 1, Mar. 1996.

\* cited by examiner

MODULAR SYSTEM FOR MONITORING BATTERIES

CROSS-REFERENCE TO RELATED APPLICATIONS

This application claims priority from US provisional patent application U.S. 62/201,162, filed on Aug. 5, 2015.

BACKGROUND

(a) Field

The subject matter disclosed generally relates to systems for monitoring batteries. More specifically, it relates to modular systems for monitoring and controlling batteries.

(b) Related Prior Art

Batteries are used throughout a variety of application, ranging from standalone instruments to large remote facilities not connected to the grid. Batteries are thus useful and widespread, but suffer from many drawbacks, such as deterioration over time, inability to know the exact capacity of the battery unless measuring devices are installed thereon, sensitivity to temperature variations, inadequacy of combining different batteries, etc. Furthermore, two distinct batteries cannot be identical, and using them together may lead to unorthodox situations such as having a healthy battery feeding electrical current to a disabled battery without our knowledge.

Some basic devices were developed to address this issue. For example, a device called PentaMetric is described at http/www.bogartengineering.com/sites/default/files/docs/PentaMetric %20Instructions %20ReaJun11-11.pdf and is used to measure current and temperature of the batteries and even their energy sources (such as solar panels, wind powered generators, etc.). However, this device lacks adaptability, since it only accepts a limited number of batteries (only 2), as it is designed as an apparatus in which batteries are housed.

Some more sophisticated methods were developed for monitoring batteries. Patent application US20040027094A1 describes a battery monitoring network including a battery node; one or more distributed nodes of a first class each including means for acquiring first battery variable information (voltage and/or temperature), processing means adapted to manipulate the first battery variable information, and a communication means for communicating with a battery node; and one or more distributed nodes of a second class each including means for acquiring second battery variable information, processing means adapted to manipulate the second battery variable information, and a communication means for communicating with the battery node. However, this document does monitoring only and is not able to correct an undesirable situation or provide optimal parameters to the batteries.

Patent application US20050038614A1 describes a remote battery monitoring system and sensors, in which a plurality of telesensors are connected to batteries in a battery string. The telesensor measure battery data such as voltage, current, and temperature and wirelessly transmit the battery data to a control and collection unit. The control and collection unit receives, processes, analyzes, and stores the battery data. Remote monitoring software running on the control and collection unit can be configured to provide warning alarms when the battery data is outside present limits. However, this document does monitoring only and is not able to correct an undesirable situation or provide optimal parameters to the batteries. Warning alarms are not useful for batteries used in remote locations, and the user of the battery, who may not be an expert, may not know how to react to such a warning alarm.

There is thus a need for a system that would correct an undesirable situation or provide optimal parameters to the batteries. A system that allows for monitoring an object (such as a battery or a load), making decisions and dissociating the object is presented below.

SUMMARY

According to an aspect of the Invention, there is provided a system for monitoring components of an electric circuit, the system comprising dissociating modules, each one of the dissociating modules for mechanical and electrical connection to a component from the components being monitored. Each dissociating module comprises: a first circuit connector and a second circuit connector for electrically connecting to the electric circuit, at least one of the first circuit connector and the second circuit connector being for electrical connection to a source of electrical power; component connectors for electrically connecting with poles of one of the components of the electric circuit; a first switch associated to the first circuit connector and a second switch associated to the second circuit connector, the first switch and the second switch being on an electrical path between the first circuit connector and the component connectors, one of the first switch and the second switch being closable for allowing current input from the source of electrical power into one of the component connectors, the other one of the first switch and the second switch being closable for allowing current output from one of the component connectors to the electric circuit; and sensors for performing measurements in the dissociating module; a computing device in communication with the sensors and with the first switch and the second switch for opening and closing the first switch and the second switch based on the measurements from the sensors, thereby configuring the switches to operate the component or not.

According to an embodiment, the component to which one of the dissociating modules is mechanically and electrically connected is a given battery.

According to an embodiment, the electric circuit comprises batteries connected in series, the system comprising dissociating modules installed on the batteries connected in series, wherein each one of the dissociating modules comprise a bypass switch, in communication with the computing device of each one of the dissociating modules, which is closable by the computing device to allow current to flow through the dissociating module while preventing current to flow through at least one of the batteries, thereby allowing the current to flow through the dissociating modules installed on the batteries connected in series while dissociating the at least one of the batteries connected in series.

According to an embodiment, the bypass switch connects the second circuit connector to one of the component connectors.

According to an embodiment, the system further comprises an input managing module in communication with the dissociating modules via the computing device, the input managing module managing input of electric power from power sources into the electrical circuit.

According to an embodiment, the computing device executes instructions to determine, based on the measurements from the sensors, that the given battery on which the dissociating module is installed needs to be charged, wherein the computing device communicates with: the computing device of other dissociating modules so that all dissociating modules in series with the given battery are bypassed and the dissociating modules in parallel with the given battery block current; and the input managing module so that at least one of the power sources feeds the electrical circuit, wherein the computing device configures the first switch and the second switch to direct inputted current from the at least one of the power sources into the given battery for recharging.

According to an embodiment, the computing device executes instructions to direct the inputted current from the at least one of the power sources into the given battery for recharging according to a given profile optimized for the recharging of the given battery.

According to an embodiment, the computing device executes instructions to determine, when communicating with the input managing module, that the power sources are insufficient for feeding at least one load and that its given battery can deliver power, wherein the computing device configures the first switch and the second switch and communicates with: the computing device of other dissociating modules in series with the given battery to have them delivering power or bypassed; and the computing device of at least one other dissociating module installed on a load to direct power from the given battery into at least one load.

According to an embodiment, there is further provided a third circuit connector for electrically connecting with an external capacity-test load through the electric circuit, the third circuit connector having a capacity-test switch, in communication with the computing device, which is closable by the computing device to allow connection between the external capacity-test load and the given battery on which the dissociating module is installed so that the given battery can discharge into the external capacity-test load while being monitored by the sensors in the dissociating module.

According to an embodiment, the computing device executes instructions to determine, based on the measurements from the sensors, that the given battery on which the dissociating module is installed can be discharged to undergo a capacity test, wherein the computing device configures the first switch, the second switch, and the capacity-test switch for the capacity test and communicates with: the computing device of other dissociating modules in series with the given battery to have them bypassed; and the computing device of at least one other dissociating module installed on a load to direct outputted current from the given battery into at least one load, wherein the computing device collects measurements from the sensors during discharging for characterizing the given battery.

According to an embodiment, the computing device of each one of the dissociating modules comprises a communication unit to exchange data, the computing device of each one of the dissociating modules being adapted to make decisions according to a common set of rules to avoid any conflict between dissociating modules, thereby allowing the system to work regardless of a number of dissociating modules.

According to an embodiment, the computing device is remotely connected to a network for inputting out outputting data used in decision-making for opening and closing switches.

According to an embodiment, the sensors comprise at least one of a current meter, a voltage meter and a thermometer.

According to another aspect of the invention, there is provided a dissociating module for monitoring an object and managing electric input into and output from the object, the object being one of a battery and a load, the dissociating module being for use with at least one other dissociating module, the dissociating module comprising: measuring devices for taking measurements of the object; a microcontroller operatively connected to the measuring devices for receiving the measurements of the object, and for operative connection to a microcontroller of the at least one other dissociating module for receiving information therefrom; and switches, operatively connected to the microcontroller, wherein the microcontroller, based on at least one of the measurements of the object received and the information received from the at least one other dissociating module, controls opening and closing of the switches for controlling electrical current in the dissociating module.

According to an embodiment, there is further provided a body having a shape adapted to cover both studs of the battery if the dissociating module is installed on the battery, to connect with the load if the dissociating module is installed on the load, and to connect with at least one other dissociating module, controls opening another dissociating module f the dissociating module is installed on another dissociating module.

According to an embodiment, there is further provided an electronic fuse in connection with the object for cutting current if the current is too high.

According to an embodiment, the body prevents outside connection to both studs of the battery if the dissociating module is installed on the battery, thereby making the electronic fuse mandatory when the battery is connected to a circuit.

According to an embodiment, the microcontroller has a remote connection to a network for data exchange.

According to an embodiment, there is further provided an integrated charger for ensuring that charging of the battery is substantially performed according to a charging profile.

According to another aspect of the invention, there is provided a dissociating module for monitoring an object and managing electric input into and output from the object, the object being one of a battery and a load. The dissociating module comprising: measuring devices for taking measurements of the object; a microcontroller operatively connected to the measuring devices for receiving the measurements of the object, and for operative connection to a network for data exchange; and switches, operatively connected to the microcontroller, wherein the microcontroller, based on at least one of the measurements of the object received and the data exchanged via the network, controls opening and closing of the switches for controlling electrical current in the dissociating module.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Figure 1:
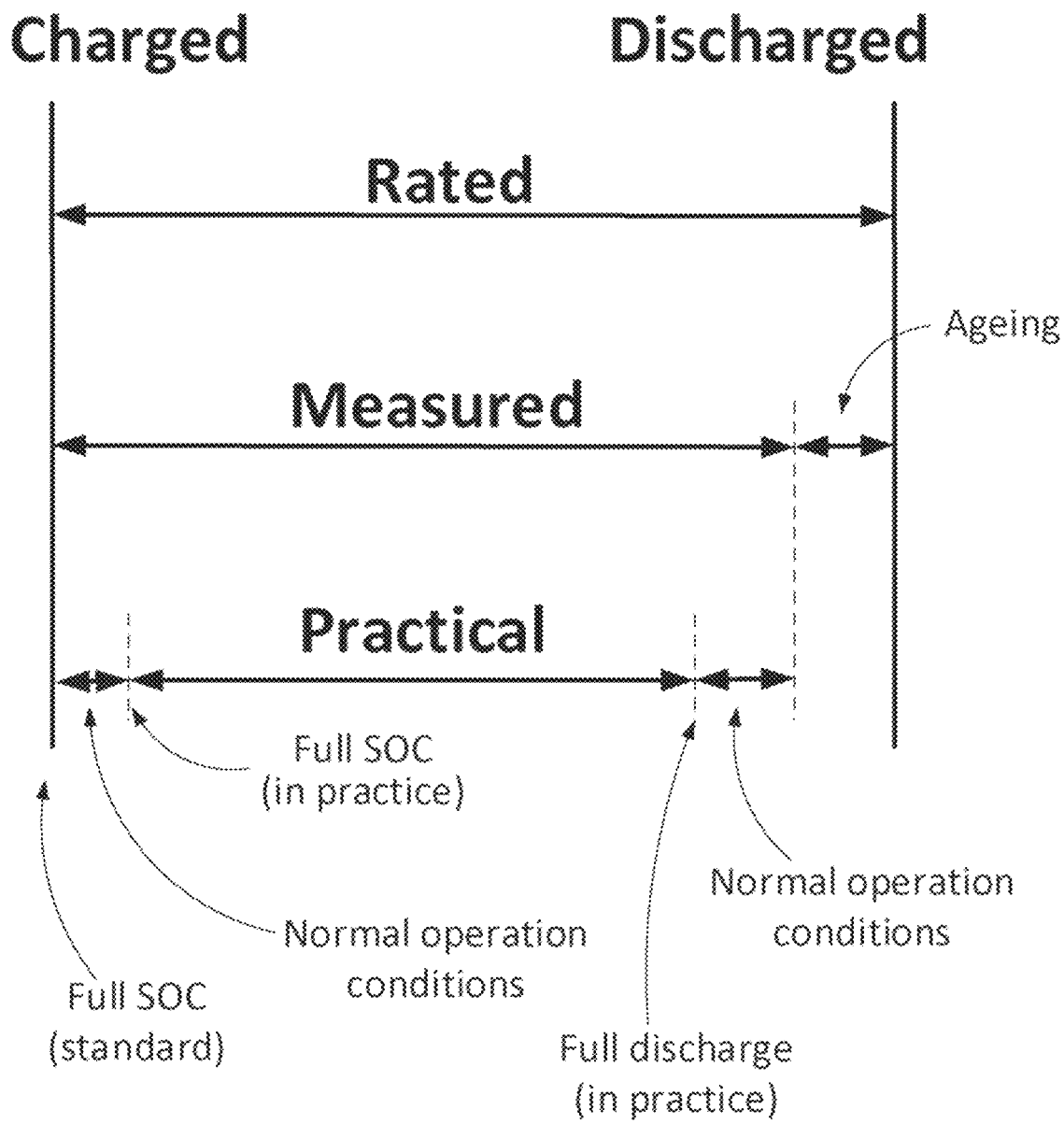
FIG. 1 is a diagram illustrating notions about the state of charge of a battery.

Prior to describing the embodiments shown in the figures, some terms or expressions used in the present description will benefit from a formal definition:

Battery bank: The system described herein is for using on batteries, or battery banks. The terms "battery bank" will be used for the purpose of the description, and are intended to comprise either batteries connected in series, or a single battery. Therefore, the terms "battery bank" will refer to either a plurality of batteries, or just one. It should however be emphasized that even though a battery bank simply means a set of batteries in series, these batteries (if there is more than one of them) will work more efficiently and in a safer way if the batteries making up a battery bank are the same model, manufactured by the same producer on the same day and in the same circumstances. Battery banks are usually connected in parallel, so that a plurality of battery banks belongs to the local electrical network.

Local electrical network: The battery banks, loads and sources form a local electrical network. In case of remoteness, the local electrical network is Isolated and thus not connected to a utility electrical network. Under other circumstances, the local electrical network can be connected to a utility electrical network, in which case the connection to the grid can be considered as a source, just as would be any other independent source, such as a solar panel, windmill, generator, etc. The terms "local electrical network" will be used to avoid confusion with the public electric network (i.e., the grid) used by utility companies, regardless of whether the local electrical network is connected to the grid or not. The local electrical network comprises a battery bank (usually a plurality thereof, i.e., two or more) for storing electric energy and giving it back to the local energy network, and at least one of the following: a load (or a plurality thereof) that uses electrical power, and a source (or a plurality thereof), also known as a charge, that converts or generates electric power to introduce it into the local electrical network. Battery banks usually operate at a voltage of 12 V (that can undergo variations), but other voltages are also possible.

Module: The module is a device that is installed (electrically connected to) on a component/object of the local electrical network, i.e., on a battery bank, a load or a source. Some modules may be adapted only for one or two types (i.e., only for the battery banks and loads, only for the source, etc.). Modules may be housed within an enclosure (also known as a box, body, housing, etc.) to hold and protect their internal components. The module may also be housed within a component of the local electrical network.

Open/closed switches: A switch refers to a switch commonly making part of an electrical circuit. The terms "open" or "closed" switches are used as they are in the technical field of electrical circuits, which is contrary to the common (general public) use of such terms. Consequently, a switch is "closed" when the contact is made and the electrical current can pass freely; it is "open" when there is no contact and the electrical current cannot pass freely anymore through the switch.

Referring now to the drawings, and more particularly to FIG. 1, a diagram illustrates issues regarding the capacity of a battery. A battery or battery bank 50 has a rated capacity which is shown in FIG. 1. However, a real battery is never fully charged or discharged as it is supposed to be. The first reason for this effect is the ageing of a battery, which prevents a battery from fully discharging as expected. The state of health (SOH) of a battery is the measured capacity divided by the rated capacity, and decreases as the battery gets older. Poor-quality maintenance, for example if a battery undergoes extreme temperature or temperature variations, or if it is never used, can accelerate ageing. A battery that is never used can discharge overtime.

Furthermore, practical effects taking place during normal operation prevents the battery bank 50 from being fully charged or discharged. Indeed, a capacity is often rated using standard tests which do not reflect the irregular otherwise non-standard use of the battery banks 50. For example, a battery bank 50 may have been rated as having a capacity of 100 Ah (Ampere hours) after being drained during 20 hours at a constant rate of 5 A. However, this capacity that the battery bank 50 should deliver suffers from non-linear effects: if a battery is used at 100 A, it will last less than 1 hour as expected; the perceived capacity will rather be in the order of 64 Ah, for example. The actual capacity thus decreases as the load (needed amperes) increase.

Other types of capacity standard are used, such as the cranking amps (CA), or marine cranking amps (MCA), measured at 32° F. Cold cranking amps (CCA) measures the current (A) that a battery maintained at 0° F. can deliver without having the voltage drop below 7.2 V. A high CCA rating is advantageous when an application required a high current during a short period of time, especially in cold conditions. The reserve capacity may also be useful: it measures the time (minutes) during which a battery maintained at 80° F. can deliver 25 A without having the voltage drop below 10.5 V.

Figure 2:
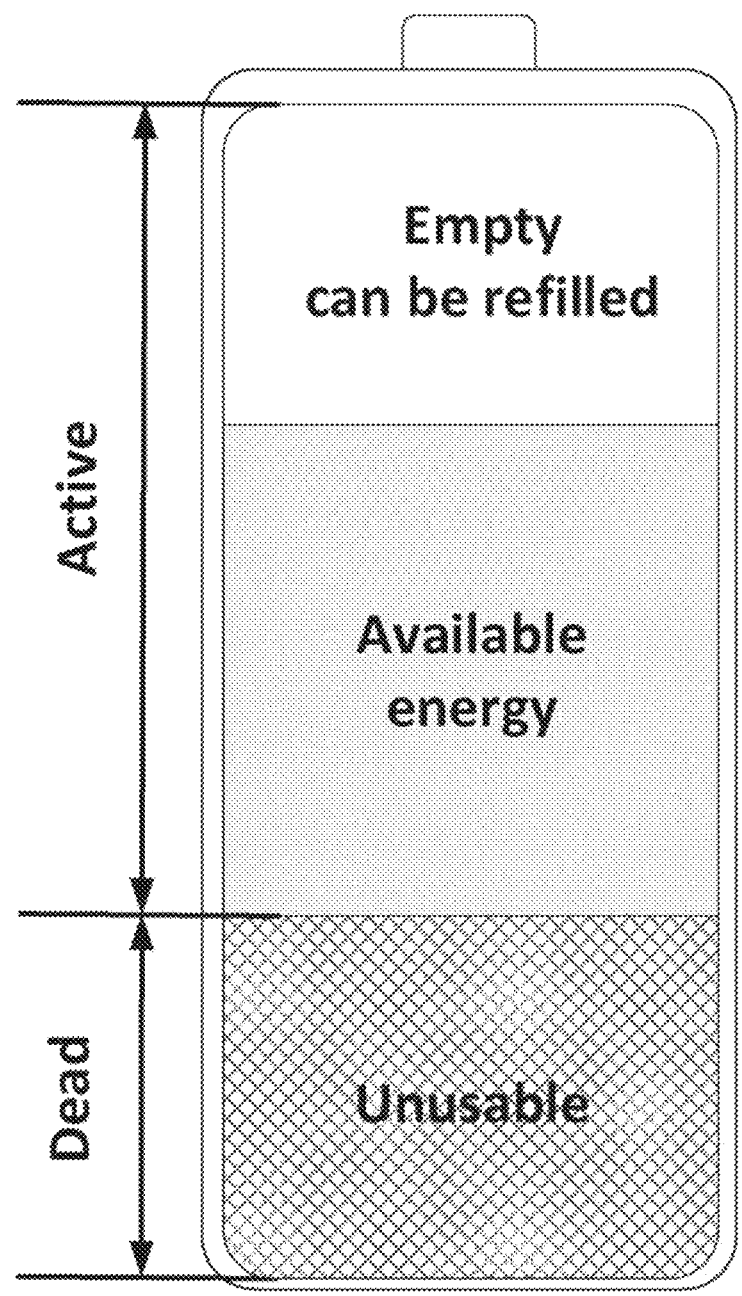
FIG. 2 is a schematic front view of a battery illustrating notions about the state of charge of a battery.

If a monitoring system knows enough key values about a battery bank, it may adequately estimate the remaining capacity of a battery. The state of charge (SOC) is the remaining capacity of a battery divided by its full charge capacity. The monitoring system is also aware that a fraction of the battery is not usable anymore for its purpose (stocking energy), as seen in FIG. 2 and discussed above in relation with ageing and decreasing state of health. A suitable monitoring system should be able to estimate this value based on the measurements it performs.

Other issues may affect the behavior of the batteries being used. For example, a battery with a low state of charge (e.g., 40%) can freeze under a given temperature threshold. Some types of batteries (e.g., lead batteries) may poorly tolerate deep discharges. To avoid deep discharges, discharge must be stopped when the battery reaches a given voltage threshold (for example, elements of a lead battery should not be brought under about 1.75 V). Sulfation is another process that may negatively affect the state of health of lead batteries. Sulfation can be "diagnosed" based on the voltage profile of a discharging battery.

Furthermore, bad practices are often used even though they are not recommended. The system described below may however, under some conditions, be able to mitigate some of these bad practices. For example, if batteries of different types are used in parallel (which is a bad practice), the system may be able to identify that this situation is occurring and to dissociate batteries in order to keep only one series of batteries feeding the load at a given time.

Another bad practice consists of charging al battery banks together, regardless of the state of charge of each battery bank. The system described below is able to isolate each battery bank or series of battery banks being charged to allow for an "individualized" charging that better respects the limits of the battery banks (e.g., avoid overcharging).

Another bad practice, although less prevalent, is the use of anti-sulfation devices during battery recharge which apply a "one size fits all" approach for preventing non-reversible sulfation of batteries. Indeed, some batteries may suffer from both reversible and non-reversible sulfation at varying degrees, and applying the same anti-sulfation treatment to all batteries is suboptimal and can damage batteries by overcharging them with power pulses. If the system can isolate batteries being charged while knowing the degree of reversible sulfation of each battery, the anti-sulfation treatment applied to each battery can be more efficient.

Finally, batteries are sometimes used in large battery repositories that serve as emergency power supply for facilities. The state of health of those batteries is sometimes diagnosed. However, this diagnosis is performed for a group of batteries, which means that faulty batteries are not found. Instead, the overall state of health of the group of batteries is being considered, and if the result is unsatisfying, the whole group is replaced, which is very costly. This is partly due to the fact that mixing new and old batteries is not a good practice, as mentioned above. However, if the system described below is able to discriminate which particular battery banks among a large group contribute to the decrease in overall capacity, it is possible to replace only the faulty battery banks. Integration with the other battery banks can be monitored as mentioned above, thus mitigating the risk of mixing old and new battery banks.

Figure 9:
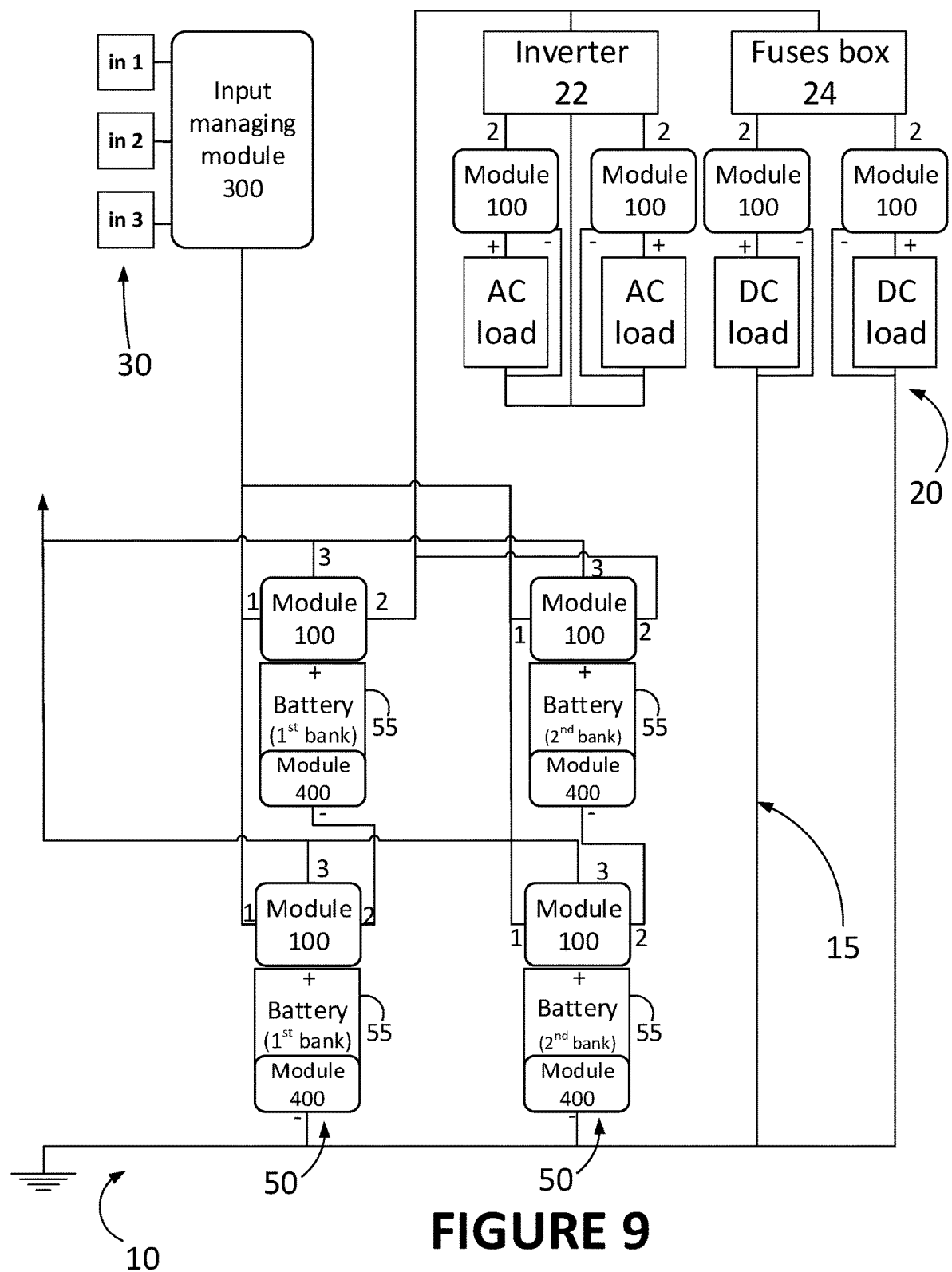
FIG. 9 is a diagram illustrating a system comprising modules, including the dissociating module of FIG. 8, installed on various electrical components, according to an embodiment.

Now referring to FIG. 9, battery banks 50 are a part of a local electrical network 15. The local electrical network 15 comprises a battery bank 50 or a plurality thereof, and at least one of the following: a load 20 and a source 30. The need for a system as described is more apparent if the local electrical network 15 comprises two or more (i.e., a plurality of) battery banks 50 configured in parallel. For example, a battery bank 50 can be used in a circuit having only a source 30 (or a plurality thereof), the purpose of this circuit being to charge the battery bank 50. In another example, a battery bank 50 would be used in a circuit having only a load 20 (or a plurality thereof), the purpose of this circuit being to feed the load(s) 20 with the battery bank 50. FIG. 9 shows a more sophisticated local electrical network 15 comprising three sources 30 (power inputs) and four loads 20. Loads 20 can comprise AC loads and/or DC loads, which would need an inverter 22 or a fuse box 24, respectively. FIG. 9 shows two AC loads and two DC loads. Wires or cables are used to connect the electrical components together.

When a plurality of battery banks 50 is used, the battery banks 50 are configured in parallel. FIG. 9 shows two battery banks 50 in parallel, each one of the battery banks 50 comprising a series of two batteries 55.

Figure 3A:
FIGS. 3A and 3B are diagrams illustrating batteries in series and in parallel, respectively, with one of the batteries being a faulty battery.

FIG. 3A shows batteries in series, wherein one of the batteries is faulty. Since voltages add up in such a configuration, the overall voltage does not reach the expected value; this configuration therefore becomes undesirable.

Figure 3B:
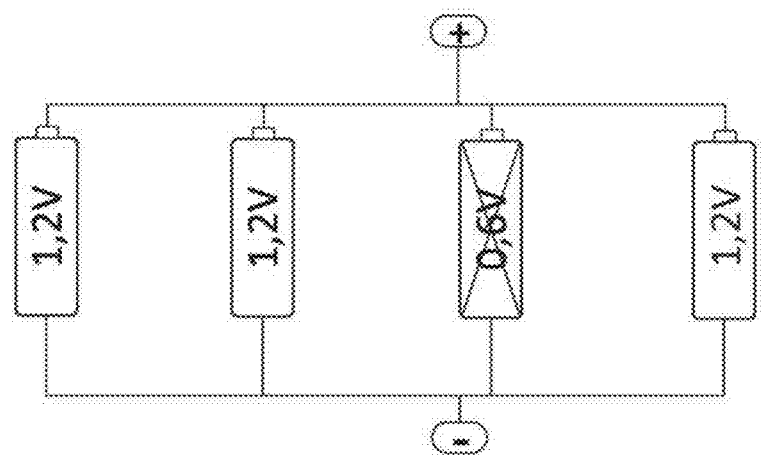

FIG. 3B shows batteries in parallel, wherein one of the batteries is faulty. Since currents (or capacities) add up in such a configuration, the overall current (or capacity) does not reach the expected value. The voltage between positive and negative sides of each battery is also supposed to be the same; this configuration therefore becomes undesirable.

FIGS. 3A and 3B thus demonstrate that regardless of how the batteries are connected, a faulty battery will introduce deficiencies into the whole circuit. Even under apparently similar conditions, each one of the batteries can evolve differently. Each battery bank 60 (or another component) is monitored and, upon detecting (based on the monitoring) a disability of one of the components of the local electrical network 16, this component will be taken off the circuit to avoid further damage. A modular system 10 is therefore provided, as shown in FIG. 9.

The system 10 is modular because the modules are physically distinct from each other and they work independently from each other. The structure of each module and the fact they are physically distinct and operatively independent implies that an arbitrary number (at least 1) and electrically-suitable configuration of modules can be provided in the system 10. For the system 10 to achieve its purpose of suitably monitoring the battery banks, modules are installed thereon. The system 10 is able to monitor battery banks 50, identify which one (if any) is faulty and dissociate it from the remaining components of the local electrical network 15.

As shown in FIG. 9, the system 10 comprises modules that can be used for a variety of purposes. The modules are to be installed on batteries 55 (which make up a battery bank 50), on loads 20 and/or on sources 30.

FIG. 9 shows a complete system installed on a local electrical network 15 with many components. The local electrical network comprises a plurality of batteries 55, both in series (thereby making up battery banks 50) and in parallel, a plurality of loads 20, including AC loads and DC loads, and a plurality of sources 30.

The system comprises at least one dissociating module 100 (or more practically, at least two, since there are usually at least two battery banks 50). The dissociating module 100 is adapted to dissociate a battery bank 50 from the remainder of the local electrical network 15 by opening the circuit around at least one of the batteries 65 making up that battery bank 50. The dissociating module 100 is thus also adapted to dissociate a battery bank 50 from the other battery banks 50 in order to alleviate the issues discussed above when battery banks 50 with different electrical properties are used together. The battery bank 60 can be protected from the local electrical network 15, and the local electrical network 16 can be protected from the battery bank 50, in case of failure of one of them.

Furthermore, the dissociating module 100 is adapted for monitoring the battery 55 under control, which is normally done by implementing monitoring functionalities in the dissociating module 100, as described below.

The dissociating module 100 is to be installed on the battery 55 or on a load as seen in FIG. 9. The dissociating module 100 is described more thoroughly in FIG. 8 where its components are illustrated.

The dissociating module 100 comprises sensors or measuring devices, which comprise a current meter 152, a voltage meter 154, and a thermometer 156 (which are shown). The current meter 152 is installed in series with the battery 55 being analyzed in order to measure the electrical current flowing therethrough. The voltage meter 154 is Installed in parallel with the battery 55, and according to an embodiment, is provided to measure a voltage of any kind, whether it is AC or DC. The thermometer 156 is located adjacent to battery 55 to be able to effectively measure its temperature. Other types of sensors are possible; if they measure quantities that are relevant for the health of the battery 55, their measurements can be carried to the microcontroller 180 and integrated to the monitoring and decision-making process performed by the microcontroller 180. The monitoring performed by the measuring devices can also be applied to a load 20 if the dissociating module 100 is located thereon.

Data collected from the measuring devices are sent to a microcontroller 180. The microcontroller 180 is a piece of hardware, such as an electronic chip or any other processing or computer device that can receive data, processing it, and eventually send it to other microcontrollers 180 upon necessity. It thereby includes a communication unit. For sending data to other microcontrollers 180, there must be a signal transmission network. Antennas 185 or equivalent thereof (e.g., transceivers) are necessary to provide a wireless network, which are practical for communication between microcontrollers 180 of different modules, and for communication via a telecommunication network for data exchange to a remote server (e.g., for data exchange with a monitoring or controlling application). A less practical but possible alternative is the use of physical cables connecting various modules for communication in addition to the existing electrical connections.

Figure 8:
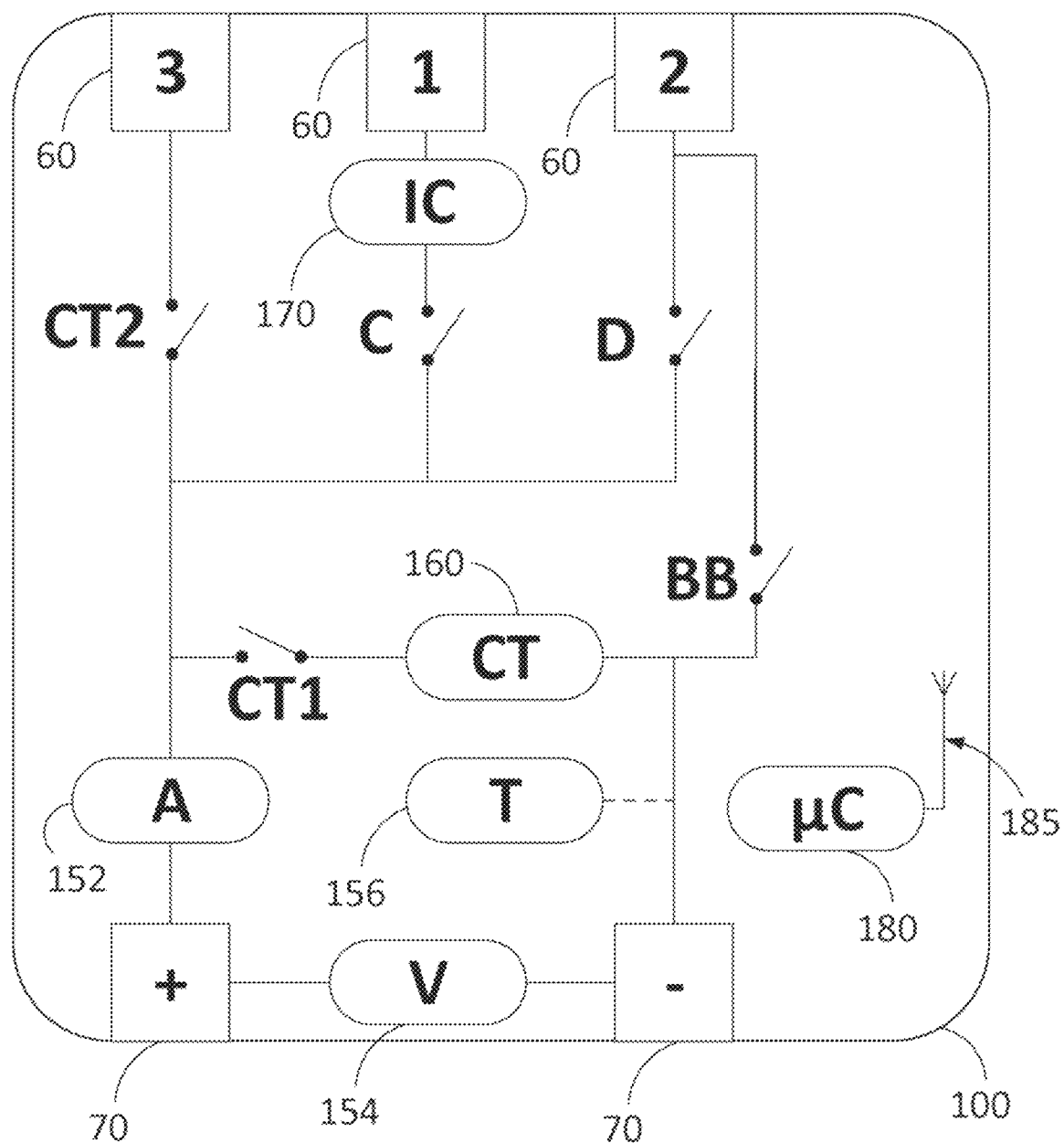
FIG. 8 is a diagram illustrating a dissociating module, according to another embodiment.

The dissociating module 100 further comprises switches to dissociate the battery 55 on which the dissociating module 100 is installed. As shown in FIG. 8, a first switch C and a second switch D are provided. There are also provided switches CT1 and CT2 for performing capacity tests (aka capacity-test switches). As will be detailed further below in reference with capacity tests, the switch CT1 is used for performing a capacity test for the battery while discharging in a module's internal load 160, while the switch CT2 is used for a similar purpose but the energy is discharged into an external load (i.e., not in the internal load 160), thereby avoiding useless energy dissipation. Module circuit connectors 60 are shown in FIG. 8 and are used to contact the local electrical network 15. Module circuit connectors 60 (positive side of the module) are marked (on the figure) with specific reference numbers that can be seen in FIG. 9 too. (As will be described below, both module circuit connectors 60 can be connected to the local electrical network 15, although one of them, or both, may be disconnected from the remainder of the module by a switch C or D associated therewith). A module-to-component connector 70 (aka component connector) is shown and used for electrical contact with a component of the circuit (which can be a load or a battery). One of the two component connectors 70 (usually the negative one) of a module can also be electrically connected to the circuit connectors 60 #2 of a next module (distinct from the first one) if some components (and their respective modules) are electrically connected in series. The last module in such a series can be electrically grounded.

Let us consider that the switches CT1 and CT2 are open (no current passing therethrough). If both switches C and D are open, the battery 55 is in standby. It is dissociated from the local electrical network 15. Having those switches open is thus what allows dissociating the battery bank 50 to which the battery 55 belongs from the local electrical network 15. As shown in FIG. 9, a dissociating module 100 can also be installed on a load 20. In this case, the load 20 would be dissociated from the local electrical network 16, a situation known as "offloading".

Once the switch D is closed, the battery 55 is not in standby anymore, but rather is a mode of operation called discharge, in which the battery delivers the stored energy to the loads 20 by providing electrical power. Closing switch D of all the dissociating modules 100 installed on batteries 55 of a given battery bank 50 closes the circuit around the battery bank 50 and enables electrical current to flow between the battery bank 50 and the loads 20. As mentioned above, having a plurality of battery banks 50 (in parallel) delivering power at the same time is not recommended. The system 10 is able to have only one series of batteries (i.e., a battery bank 50, which includes a battery 55 alone according to the definition provided above) at a time deliver current to the load(s) 20, which is preferable. If the current delivered by the series of batteries 55 is not sufficient, the dissociating module 100 of the battery bank 50 being discharged will communicate with other dissociating modules 100 on other battery banks 50 to have these other battery banks 50 deliver current too, but in a controlled fashion: if voltage is too unstable, switches can be opened or closed (by the microcontroller 180 that controls them inside the dissociating module 100) to make sure that the voltage is kept constant enough and that the delivered current is sufficient for the loads 20.

If switch C is closed instead of switch D, the battery is in a mode of operation called charge, in which the battery receives (and stores) energy from the sources in the form of electrical power. Closing switch C of all the dissociating modules 100 installed on batteries 55 of a given battery bank 50 closes the circuit around that battery bank 50 and enables electrical current to flow between the battery bank 50 and the sources. Since each battery bank 50 is charged independently from the others, it can be charged according to the optimal or recommended algorithm. If all battery banks are of a different type (multi-chemistry battery network, i.e., batteries such as AGM, NiCd, NiMH, PbA, SLA, VRLA, etc.), in different states of charge or have any difference, it does not matter since the charging algorithm (which voltage and/or current and/or temperature should be applied) of each one of them can be respected. An integrated charger (IC) 170 can be provided in the dissociating module 100 at the circuit connector for the input managing module 300 (as shown in FIG. 6 or 8) to manage the charging profile (voltage, current, and their time profile, etc.) of the battery 65.

Figure 5:
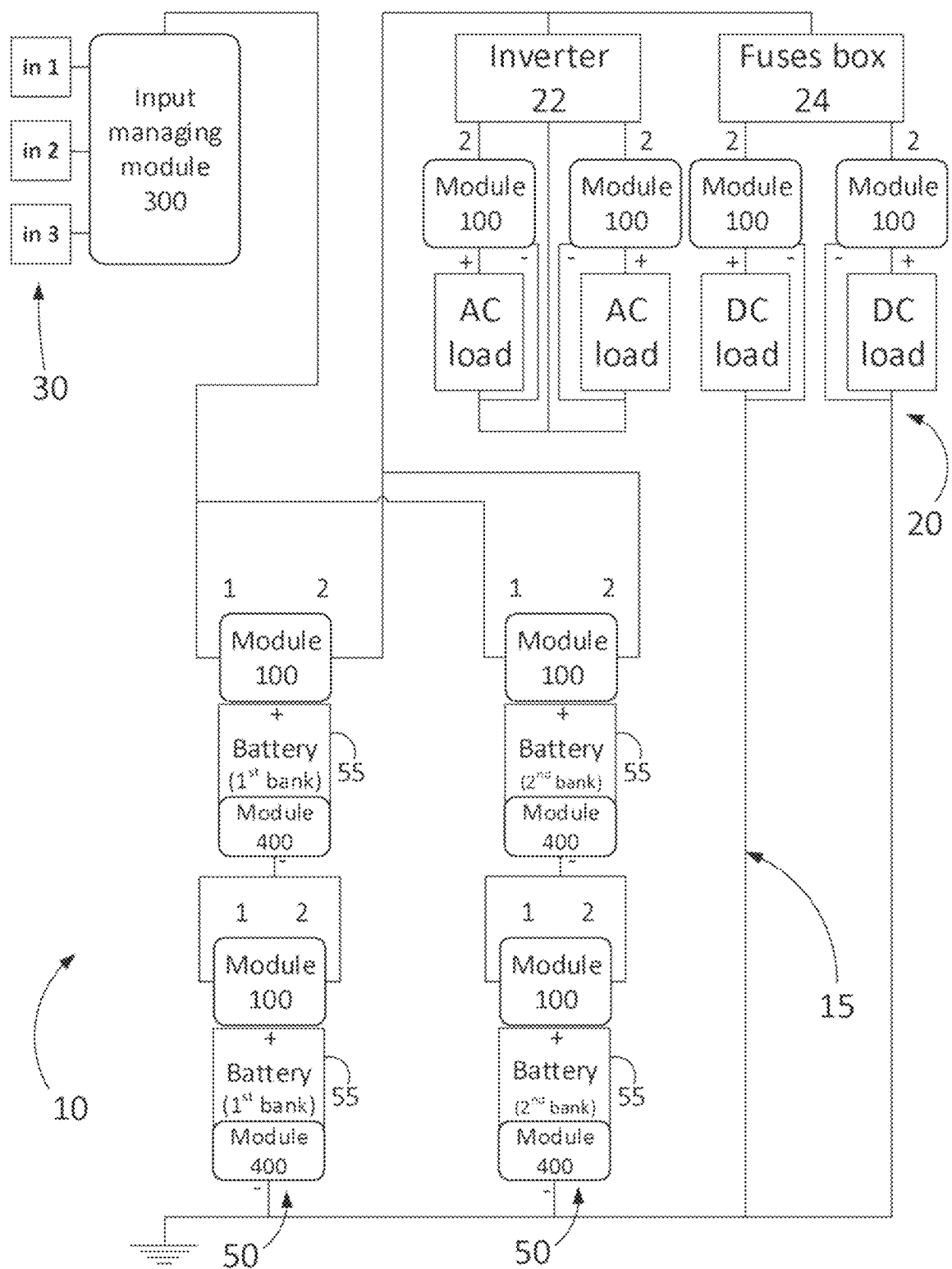
FIG. 5 is a diagram illustrating a system comprising modules, including the dissociating module of FIG. 4, installed on various electrical components, according to an embodiment.
Figure 6:
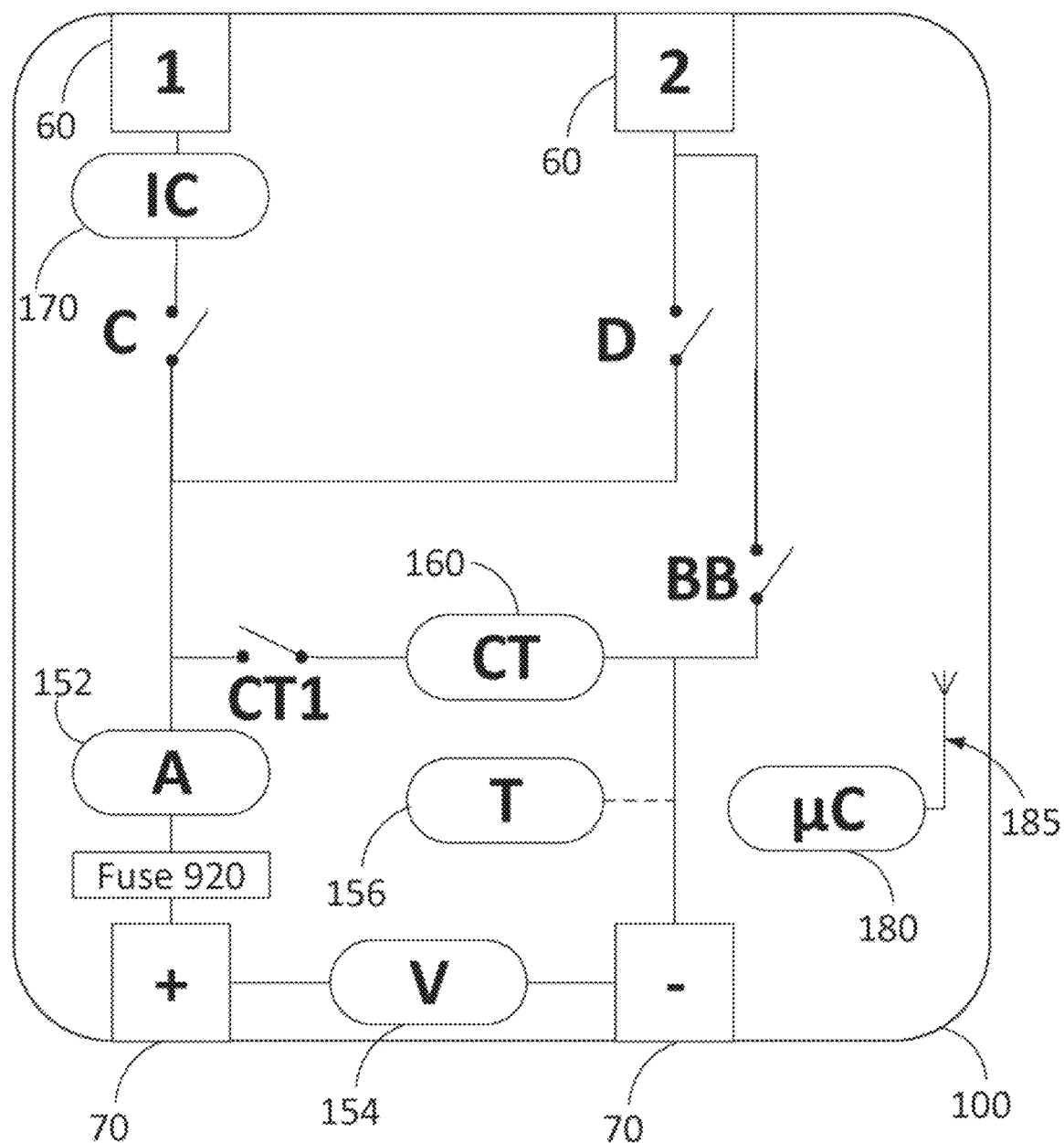
FIG. 6 is a diagram illustrating a dissociating module, according to another embodiment.
Figure 7:
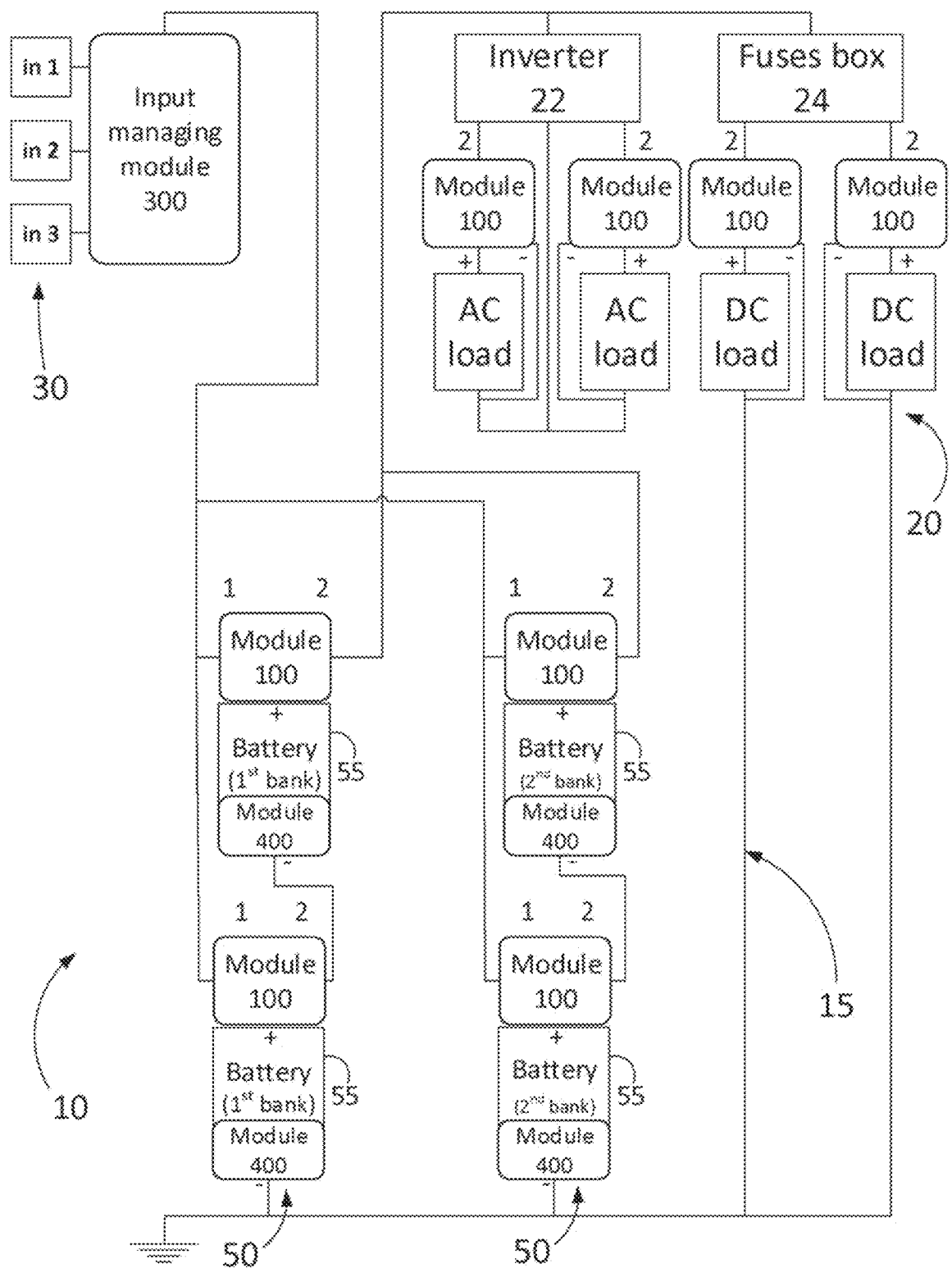
FIG. 7 is a diagram illustrating a system comprising modules, including the dissociating module of FIG. 6, installed on various electrical components, according to an embodiment.

According to an embodiment shown in FIG. 6 or 8, and preferably, a bypass BB is provided to allow individually charging each battery 55 in a battery bank 50. When the switch of the bypass BB (i.e., the bypass switch) is closed, the module circuit connector 60 #2 for the module is directly connected to the negative component connector 70 of the same module. No current is directed into the battery of that dissociating module 100. If all dissociating modules 100 on a battery bank 50 are bypassed but one, the battery 55 on which this dissociating module 100 is installed will be individually charged. The presence of the bypass BB requires the dissociating modules 100 to be connected in series by their connector 1, as shown in the systems 10 of FIGS. 7 and 9. If the dissociating module 100 does not comprise a bypass BB, as in FIG. 4, the dissociating modules 100 in a system 10 such as the one shown FIG. 5 should not be connected in series by their connector 1.

Furthermore, once the switch configuration is in a charging mode, the dissociating module 100 can determine if charging is completed. Then, instead of dissociating the battery bank 50 from the local electrical network 15, the dissociating module 100 leaves the switches as they were during the charging mode and make sure another voltage (called float voltage) is applied to the battery bank 60, to provide trickle charging to the battery. Trickle charging is the maintenance charging that can be performed on a battery which compensates for the charge loss of an unused battery, characterized by a float voltage. Trickle charging under the float voltage (or providing no voltage at all) may induce sulfation, while higher voltage may cause corrosion. The dissociating module 100 is adapted to monitor the voltage applied is the float voltage and correct the situation if it is not the case. This way, a charged battery remains fully charged; both self-discharging and rapid ageing is greatly prevented. It should be noted that the float voltage is dependent upon battery type and temperature; since the dissociating module 100 is aware of both these variables, necessary adjustments can be applied.

Closing both switches C and D is irrelevant for a battery bank 50, which cannot be simultaneously in charge and discharge modes. However, closing both switches C and D of a dissociating module 100 installed on a load makes the load work in its normal mode of operation. Therefore, a dissociating module 100 can be adapted to a battery or a load, but when installed on a load, the only modes of operation that are useful are the offloading (when both C and D are open) and normal (when both C and D are closed).

Now, let us consider that the switch CT1 is closed. This is useful only if the dissociating module 100 is installed on a battery (useless on a load), and if both switches C and D are open. Doing so closes a loop in the electrical circuit around the battery 55, while at the same time dissociating the battery bank 50 from the electric network (since switches C and D are open). A local battery discharge loop is thus created. A capacity-test (CT) internal load 160 can be provided to drain the energy out of the battery 55. The energy is therefore dissipated into the internal load 160. This process is performed in a controlled fashion by the microcontroller, which decided to empty the battery 55 to know how much energy is actually stored therein (usually measuring the capacity in Ah or other capacity test standards which are described above). For example, the microcontroller can drive the battery 55 to its maximal capacity (have it charge until the battery is full and cannot take more energy), and then have it discharge into the CT internal load 160 to measure how much energy or capacity was actually stored in the battery 55. A too large deviation from the nominal capacity of the battery indicates that the battery does not work anymore as it should and should be replaced. Performing those measurements also helps the microcontrollers know the actual capacity of all batteries, their state of health, and make more realistic forecasts of the overall capacity of the local electric network, which may help in making better decision with regard to offloading a particular load, for example.

According to an embodiment, a switch CT2 is provided in replacement of, or in addition to, the switch CT1. The switch CT2, illustrated in FIG. 8, acts like the switch CT1 and for performing the same test. However, the CT2 allows the redirection of the battery energy to be dissipated not into an internal load 160, but rather into an external load, e.g., a lamp, an air conditioner, an appliance or the like. This configuration avoids the dissipation of energy into heat within the internal load 160 and redirects the flow of energy extracted from the battery under test into more useful electricity-consuming equipment, optionally via the input managing module, as shown in the circuit of FIG. 9.

According to another embodiment, the battery 55 undergoing a capacity test is electrically connected to another battery 55 in charging mode, so that the energy spent during the capacity test is not lost, but rather stored in another location in the local electrical network 15.

According to an embodiment, there is provided a means to inform users who are present on-site of the mode of operation of the battery banks and modules. For example, such a means can comprise an LED, the color of which indicates the mode of operation, which is an inexpensive and practical way to indicate the active mode. There can also be a plurality of labelled LEDs, the one being illuminated indicating the active mode. Prerecorded sounds or voices can be used instead or in addition to the visual indications. A screen integrated to the module can be implemented, but the cost of this alternative may be a deterrent compared to a single LED.

The following table summarizes the information provided above regarding the effect of switches on the battery banks and on loads on which the dissociating module 100 is installed. The table is directed to an embodiment in which the switches CT2 and BB are absent or ignored (i.e., considered to be open switches), such as the embodiment of the dissociating module 100 shown in FIG. 4. An exemplary column about the visual indications (LEDs) is also provided. While this column comprises examples only (the color or patterns can change), the other columns are not exemplary since they indicate how an object (battery 55, load) reacts to a change in the switch configuration of its dissociating module 100. The microcontroller 180 of a given dissociating module 100 opens and closes the switches (i.e., configures the switches) into the appropriate configuration for a desired mode of operation. By communicating together, all dissociating modules 100 have their switches configured so that the underlying component is operated as intended.

| | | | Module installed on . . . | | |
|---|---|---|---|---|---|
| CT1 | C | D | battery | load | LED status |
| open | open | open | standby (dissociated) | offloading (dissociated) | flashing red |
| open | open | closed | discharge | — | red |
| open | closed | open | charge | — | flashing green |
| | | | trickle charge | | green |
| open | closed | closed | — | normal operation | red (load powered) off (load |

|  |  |  | Module installed on . . . |  |  |
| --- | --- | --- | --- | --- | --- |
| CT1 | C | D | battery | load | LED status |
| closed | open | open | capacity test | — | unpowered) flashing yellow |
| closed | open | closed | — | — | — |
| closed | closed | open | — | — | — |
| closed | closed | closed | — | — | — |

It should be noted that the operating modes described in the table are only applied to the component or object (batteries 55 in a battery bank 50, load 20) being monitored and controlled by the dissociating module 100. It means that operating modes of different components or objects are independent one from the other. For example, one battery bank 60 could be discharging, while another one is in standby (dissociated) and a last is undergoing a capacity test; while one load 20 is being used and another one is offloaded (dissociated).

As mentioned above many times, the dissociating module 100 is able to dissociate the object on which it is installed from the electrical circuit to which the object belongs. This is done by removing electrical contact from (at least) one of the poles of the object, thereby opening the circuit at this place and preventing electrical current to go therethrough. This provides several advantages depending on the object being dissociated.

Let us consider a local electrical network 15 having electrical sources 30 or charges which are sufficient to provide power to the local electrical network 15. One can suppose the batteries will be sufficiently charged and will be able to provide the electrical power to the loads 20, which in this case require a relatively low power to work. The problem, as discussed above, is that battery banks 50 are never totally identical. It means that the output voltage of both battery banks 50 may be differ slightly (or, in the worst case, considerably). If battery banks 50 installed in parallel have different output voltages, it means that some of the current will flow from one of the battery bank 50 to the other one. This can drain the battery bank 50 since power can flow in the wrong way. Clearly, since the electrical power required by the loads 20 is low and can be addressed by only one battery bank 50, the other one of the battery banks 50 can be dissociated to avoid any issue of voltage difference between parallel battery banks 50. It means that the microcontroller 180 needs to identify the voltage difference between both battery banks 50 and identify that having only one of the battery banks 50 work can still satisfy the loads 20. In fact, the microcontroller 180 can simply identify that the power requirement can be met even with only one battery bank 50 and have dissociate the unnecessary one regardless of the voltage difference (e.g., by dissociating the head battery 55 of the presently unnecessary battery bank(s) 50), since it is a good practice to have only one kind of battery bank 50 running at a time in a circuit.

In another example, let us consider that sources 30 are not able to produce a lot of power (weak wind for the windmill, too many clouds for the solar panels, etc.) and that loads 20 require too much power compared to what is produced. The dissociating modules 100 of the battery banks 50 will be aware of the disequilibrium between the production and consumption rates and will thus be able to anticipate a shortage of energy in the battery banks 50. The dissociating modules 100 installed on the loads 20 can be informed of this situation and they can dissociate the loads 20, i.e., perform offloading. All loads 20 can be dissociated, or only one or some of them, thereby shutting down the equipment being dissociated. Advantageously, in this case, the modules can have predetermined criteria for deciding which loads are dissociated. For example, user-defined priorities, stating that some loads are unimportant while other should never be dissociated, could be stored and used by the modules (e.g., in a remote cottage having night lights and a refrigerator, the night lights can be dissociated in order to keep the refrigerator working longer). Equipment that requires a lot of power even when not being used, such as TV set-top boxes, are good candidates for early dissociation. In another example, the modules can identify the load which drains the most power out of the batteries and have it dissociated to protect the other loads from an upcoming power shortage.

In another example, the dissociating module 100 can isolate a series of batteries 5 (in a battery bank 50) and make sure only one series at a time is being charged according to a pattern which is optimal for the battery type being charged. For example, lead-acid and lithium-based batteries are preferable charged using a two-stage charge method, whereas other types of batteries would be charged using different patterns, charging rates, etc.

Although the dissociating module 100 can be electrically powered by anything that can provide electrical power, it is advantageously powered by the battery 56 on which the dissociating module 100 is installed or by the current that provides power to the load on which the dissociating module 100 is installed.

According to an embodiment, the battery bank 50 is made up of a plurality of batteries, and a dissociating module 100 need only be installed on one battery of the battery bank 50. According to an embodiment, the dissociating module 100 is installed on the head battery, or first battery, of the battery bank 50 (this is briefly discussed further below, in reference with FIG. 11).

Figure 10:
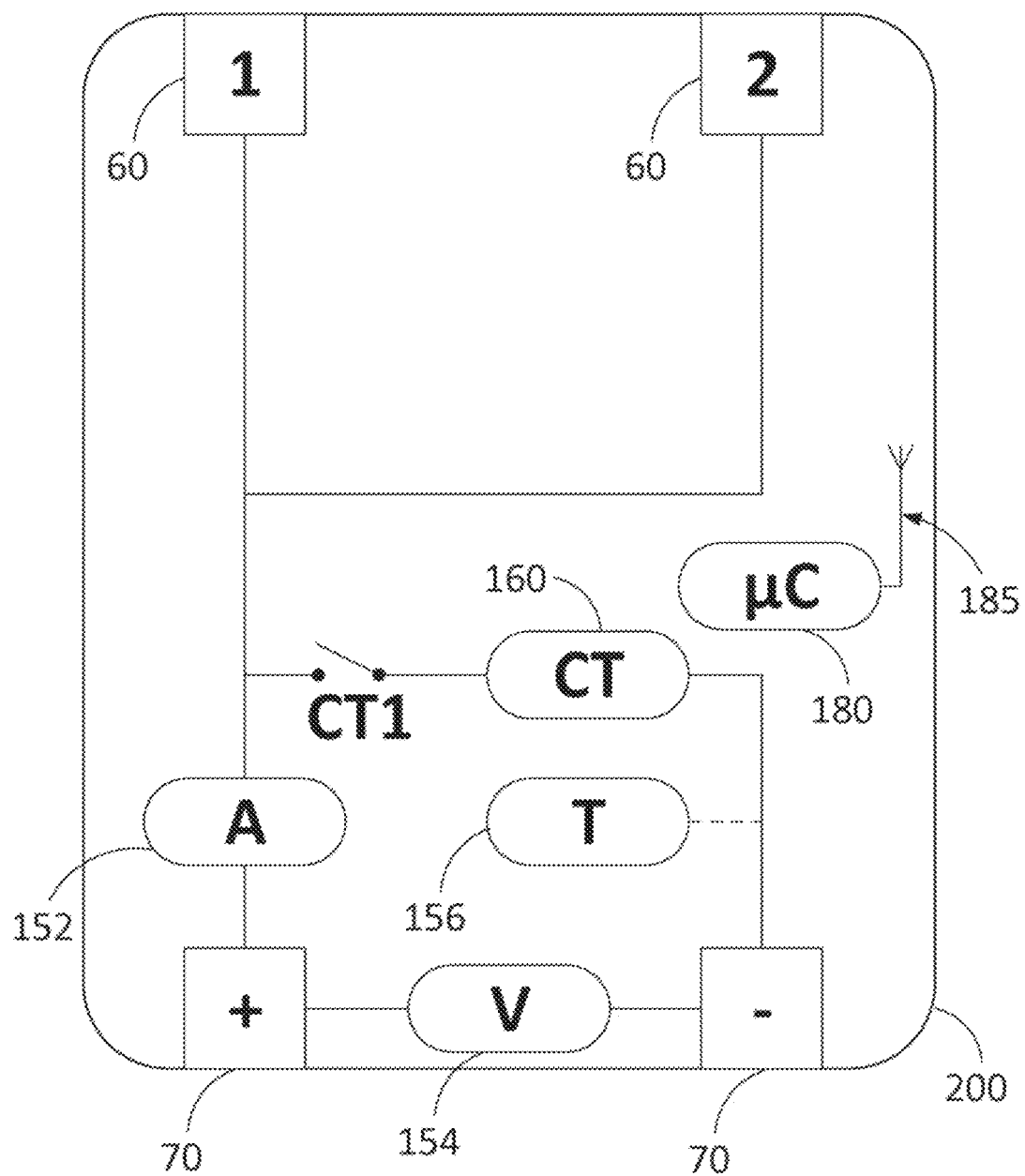
FIG. 10 is a diagram illustrating a monitoring module, according to an embodiment.

Now referring to FIG. 10, there is shown a monitoring module 200. The monitoring module 200 illustrated therein comprises the same parts as the dissociating module 100, except for switch C and switch D, which are absent from the monitoring module 200. This is explained by the fact that the dissociating module 100 is adapted to perform monitoring tasks in addition to its dissociation functionality, while the monitoring module 200 is adapted to perform monitoring tasks only.

Figure 11:
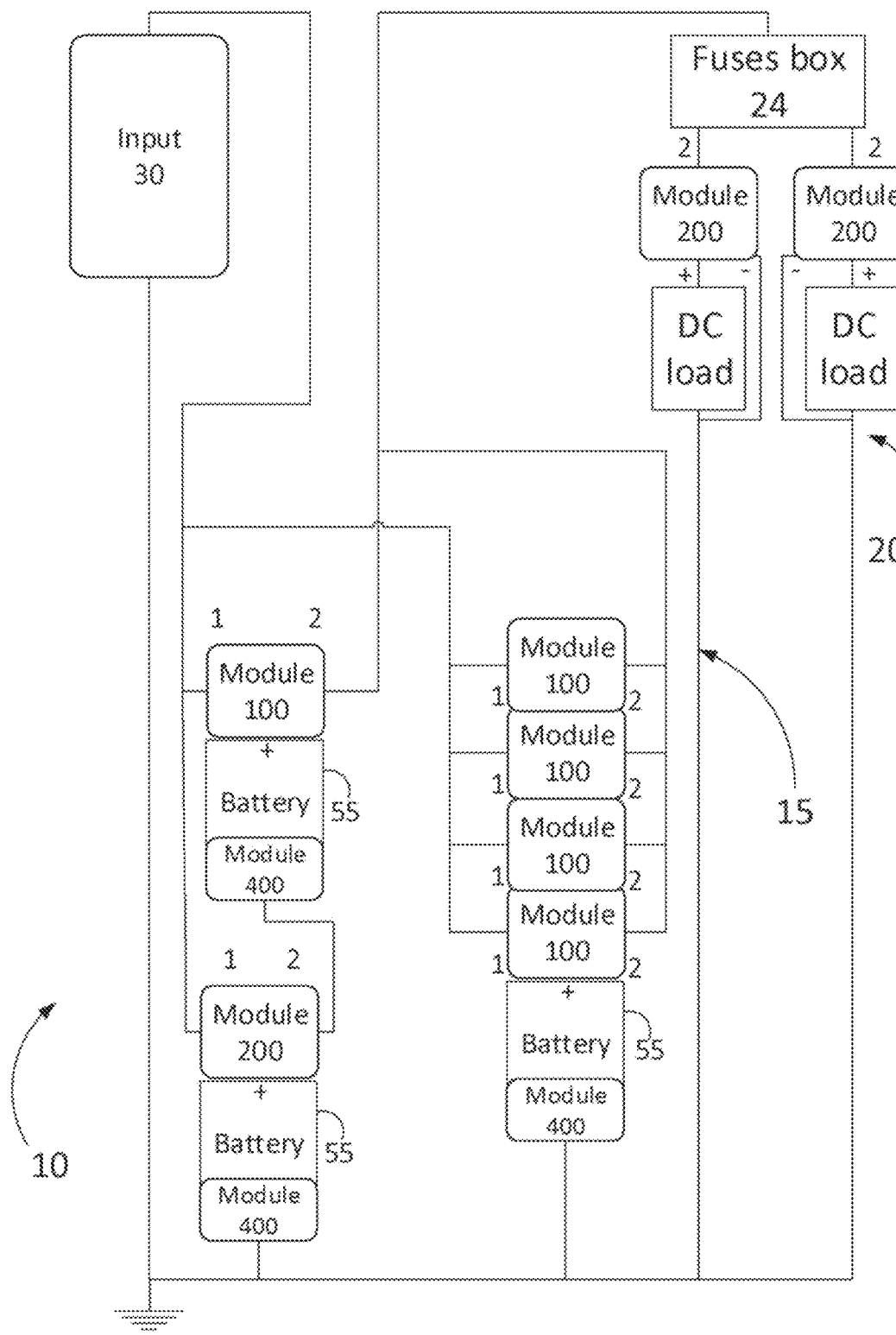
FIG. 11 is a diagram illustrating a system comprising modules installed on various electrical components, according to another embodiment.

The monitoring module 200 is to be installed on battery 56 or on a load 20 as seen in FIG. 11. The monitoring module 200 comprises sensors or measuring devices, which comprise a current meter 152, a voltage meter 164, and a thermometer 156. The way they are installed is described above in reference with the dissociating module 100. Again, other types of sensors are possible. Data collected from the measuring devices are sent to the microcontroller 180, as described above in reference with the dissociating module 100.

The monitoring module 200 can be used on the same components or objects as a dissociating module 100, and can be powered in the same way as for the dissociating module 100. An example of this situation is found in FIG. 11, wherein the first battery bank 60 on the left has a head battery (first battery 55 on top) with a dissociating module 100 thereon, while the battery that is not a head battery (second battery 65, below the first one) may simply have a monitoring module 200 thereon.

According to an embodiment, all or a part of the data accumulated and processed by the microcontrollers 180 are sent or shared on the internet (or any other suitable remote network, such as a telephone network). This is particularly advantageous for remote or distant information acquisition and/or decision-making. A notable example is the case of remote shacks; it is preferable to know that batteries need to be replaced or added before arriving on site. Remote access to data lets the user know that his shack has a very low capacity due to the bad condition of most battery packs, and will be able to buy new ones and bring them on the next stay. Networks other than the internet such as satellite phone network, can also be considered since remote places may lack access to the internet network.

If a network is to be used to receive such data from remotely-installed modules, a user-interface may be provided to display the information (raw and/or processed) to the user. A website, or other variations thereof, such as a mobile application, can be used to visualize the information on a physical display or screen (on any kind of computing device). The data exchanged may include measurements from sensors and actions performed by the modules (data transmitted by the modules to the user or to a remote server), or instructions, preferences and intended uses of the local electrical network 16 (data received by the modules).

As seen in FIG. 9, other modules can be provided in the modular system, such as an input managing module 300 or an identification module 400.

Figure 12:
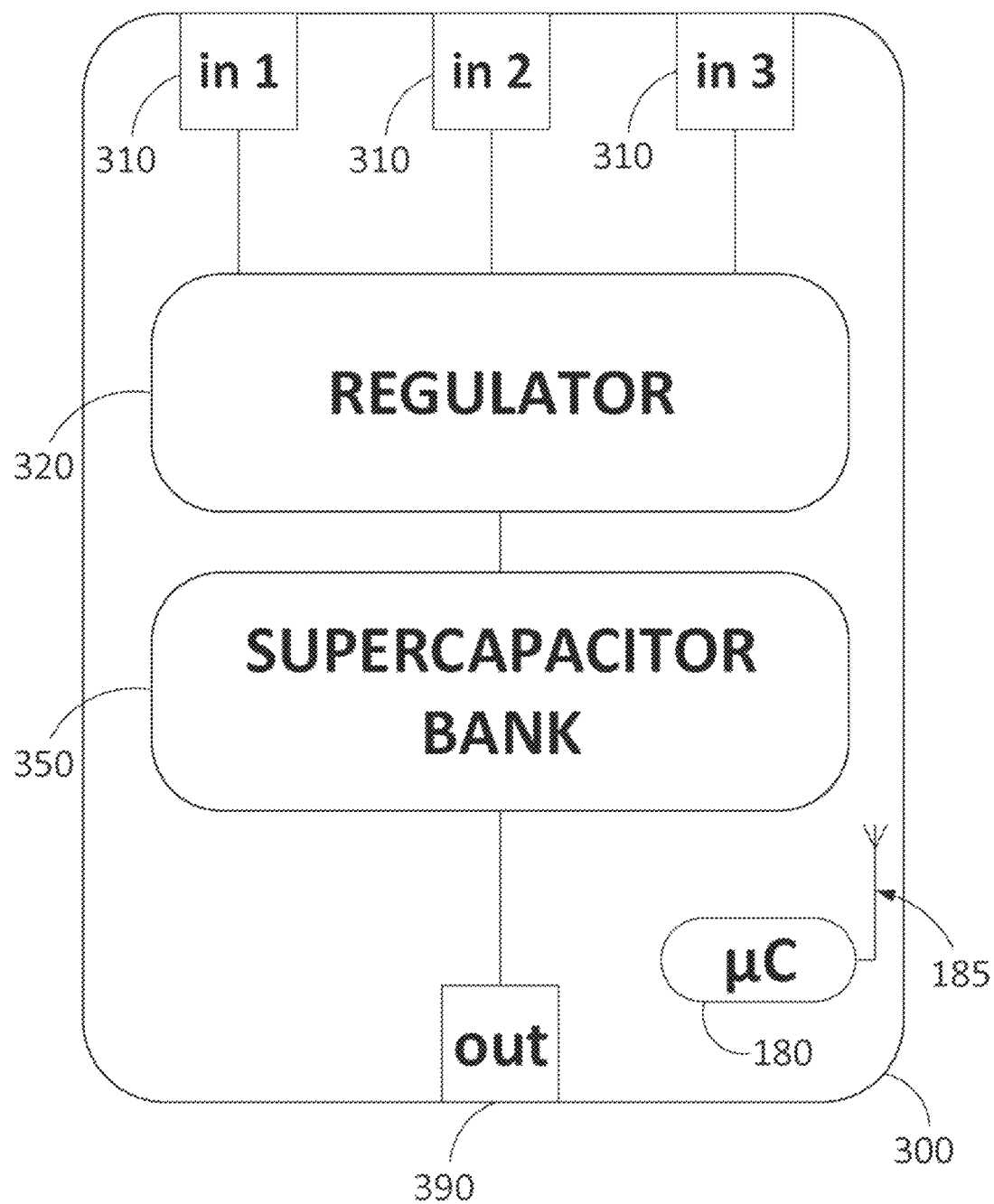
FIG. 12 is a diagram illustrating an input managing module, according to an embodiment.

According to an embodiment and referring to FIG. 12, an input managing module 300 is provided to manage the electrical power inputted into the local electrical network by the sources. The input managing module 300 comprises input contacts 310, which are the electrical contacts connected to the sources, and an output contact 390 which is connected to the local electrical network. These input contacts 310 are connected to a regulator 320. The primary function of the regulator 320 is to gather the incoming electrical power and to make sure the electrical power is then introduced into the local electrical network 15 in a suitable fashion. The input managing module 300 comprises a microcontroller 180 for receiving data and possibly making decisions.

Although the input managing module 300 can be electrically powered by anything that can provide electrical power, it is advantageously powered by the sources on which the input managing module 300 is installed.

Since the sources (e.g., solar panels, windmills, etc.) may have a varying output (i.e., input to the system), it may be useful to make sure the electrical power distributed to the battery banks does not consist of energy peaks that damage the battery banks and are difficult to stock. According to an embodiment, the input managing module 300 comprises a supercapacitor bank 350 for stabilizing or at least time-spreading the electrical power variations at the module output. Supercapacitors are not able to withstand high voltages and cannot charge large quantities of energy. However, unlike batteries, supercapacitors can absorb or deliver energy very quickly and have a virtually unlimited lifecycle. If the system experiences a power peak that could be harmful or difficult to absorb by the battery banks 50, the supercapacitor will be able to accept and accumulate the energy incoming as a power peak, and deliver this energy at a rate (i.e., power) more suitable for charging a battery. In other words, the supercapacitor is good candidate for regulating the incoming power because it can accept a high current and deliver it at any rate on demand.

According to an embodiment, there is provided a visual indication of the input from the sources 30. For example, an LED (or any lighting device) can be operatively connected to the input contacts 310. If current is flowing therethrough, the LED would light; if there is no current, the LED would be off. Other types of indication (sound, ightbulb, display, etc.) can be used.

Figure 13:
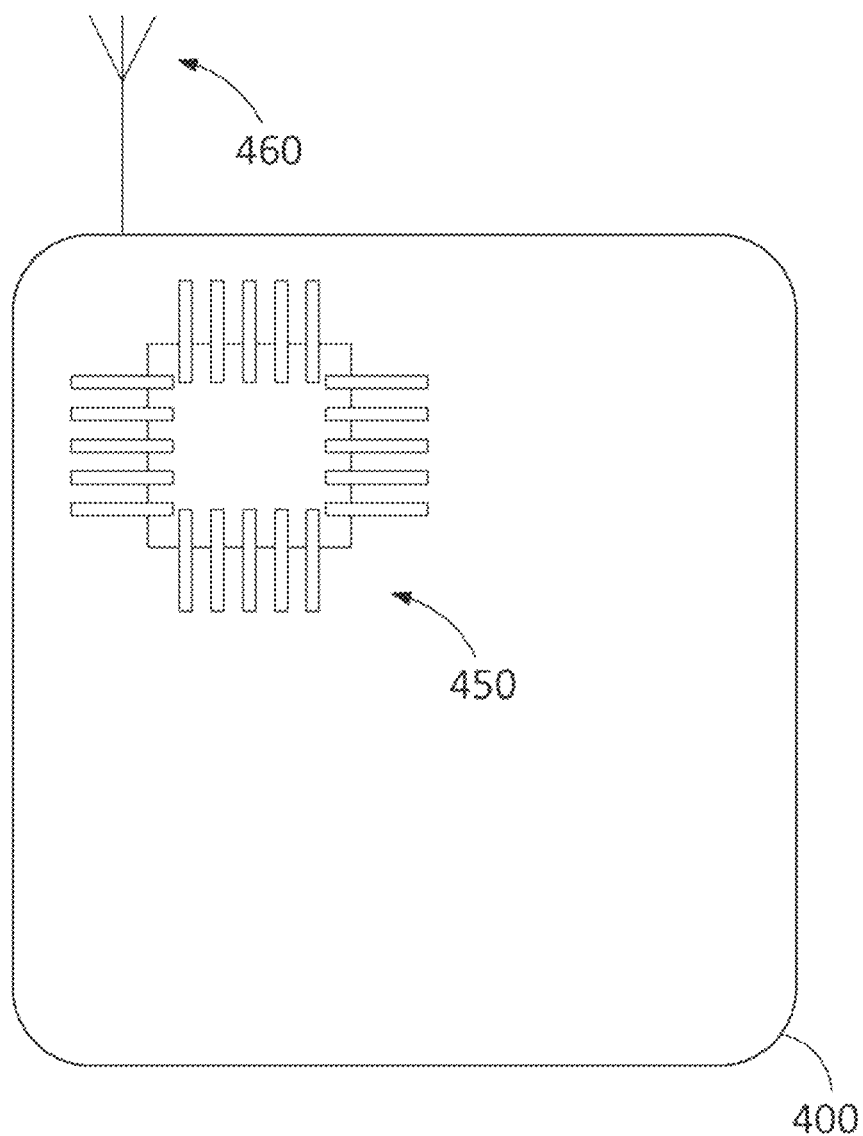
FIG. 13 is a diagram illustrating an identification module, according to an embodiment.

According to an embodiment, there is provided an identification module 400 for identification of an object, usually a battery 56, as shown in FIG. 13 and in the system of FIG. 9. The identification module 400 comprises an identification means 450, which can be embodied by various identification technologies. RFID or other radio identifiers can be used to provide identification. A chip with an antenna 460 can be used. A device producing an optical, electrical or magnetic signature can be used, etc. The identification module 400 is installed on a battery 55 or load to provide identification to the object itself.

The identification module 400 is preferably wirelessly connected to the surrounding module(s). In this case, the wireless connection is a short-range connection to avoid confusion and interference between various identification modules 400. A given dissociating module 100 or monitoring module 200 will not substantially detect many identification modules 400; the identification of the battery on which the dissociating module 100 or monitoring module 200 is installed should be unambiguous and straightforward. This issue is avoided if a wired connection between a dissociating module 100 or monitoring module 200 and the identification module 400 is used instead, but this alternative configuration is less convenient. According to an embodiment, the identification module 400 is integrally installed in (or on) the battery 55, as if they were only one object (from the user point of view).

If the identification module 400 is passive (e.g., a passive RFID), it does not need to be powered (it is powered by being interrogated by computing device of all dissociating modules another dissociating module 100 or 200). RFIDs are usually passive, but they may also be active. In a case such as this one, the identification module 400 can be made to be powered by the battery 55 on which it is installed.

Figure 14:
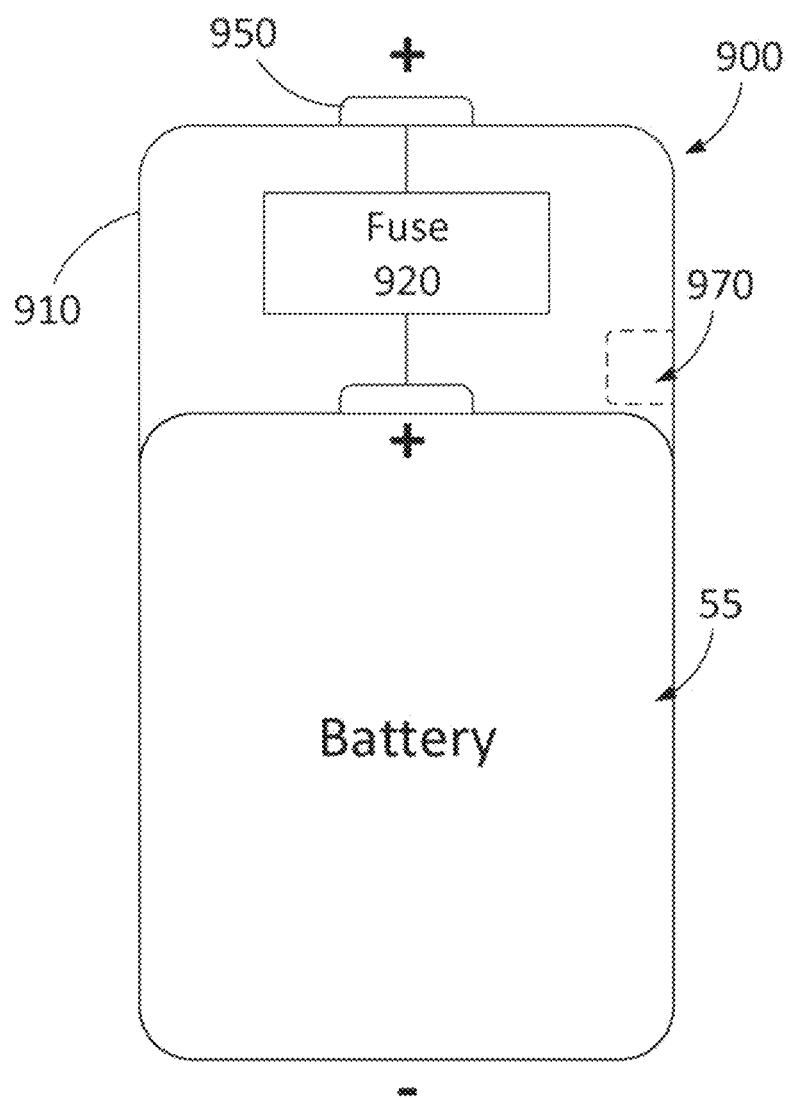
FIG. 14 is a diagram illustrating a module support, according to an embodiment.

According to an embodiment, there is provided a module support 900 for supporting a module on a battery, as shown in FIG. 14. According to an embodiment, the module support 900 comprises an enclosure or body 910 that covers or hides at least one of the studs of the battery, and in this case the module support 900 comprises an additional stud 950 on which the dissociating module 100 or 200 can be electrically connected.

It is thus possible to install a fuse 920 on the battery stud, and a new stud on the module support 900. The fuse 920 is thus seamlessly installed on the battery 665 and protects it from overcurrents.

Figure 4:
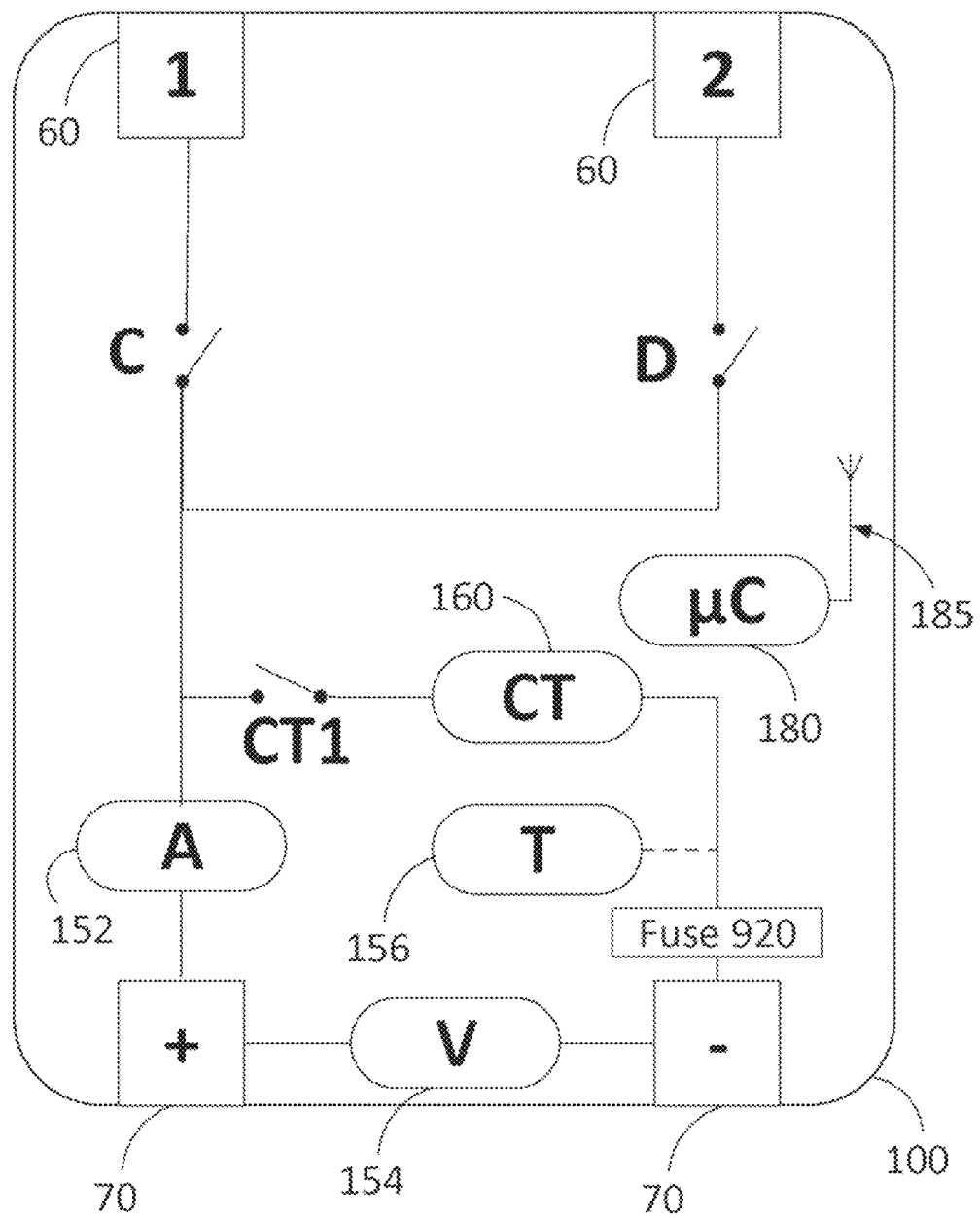
FIG. 4 is a diagram illustrating a dissociating module, according to an embodiment.

According to another embodiment, the fuse 920 is an electronic fuse (i.e., a piece of circuitry acting like a fuse) installed within the dissociating module 100; the electronic fuse cuts off the current if it is too high, and the dissociating module 100 may still be used thereafter without having to change the fuse 920. The electronic fuse is advantageously located, in the circuit, close to one of the connections to the battery 55, as shown in FIGS. 4 and 6, for example at the location of the current meter 152 (FIG. 6), so that any closed circuit involving the battery 55 would also contain the electronic fuse. This configuration ensures maximum safety since any current outputted by the battery 55 would also cross the fuse and therefore any short circuit involving the battery 55 is prevented. Locations of the fuse 920 within a module illustrated in FIGS. 4 and 6 are exemplary; the exact location can be chosen regardless of the type of module (i.e., whether it is a module as shown in FIG. 4, 6 or 8).

According to an embodiment, the module support 900 provides a dedicated identification module support or identification module housing 970 for the identification module 400, which can thus be seamlessly integrated on the battery 55 too, and which has the appropriate distance to the dissociating modules 100 or 200, as discussed above.

According to an embodiment, the thermometer 156 is installed in the module support 900, thereby measuring the temperature at the stud of the battery or very close to the stud or to the surface of the battery 55. This may be preferable than having the thermometer 156 in the dissociating module 100 (or monitoring module 200), because the presence of a module support 900 may imply that the dissociating module 100 (or monitoring module 200) is farther from the battery 55 than it would be otherwise. It is also possible to have thermometers at both locations, or keep the thermometer 156 in the dissociating module 100 (or monitoring module 200) only if the precision of the temperature measurement is not critical (or if correspondence between the temperature of the dissociating module 100 and that of a battery 55 can be established, for example).

Although all modules were not specifically shown as being electrically powered, various configurations may be used to provide electrical power to the components of the various modules. For example, a module may be installed at a positive side of a battery 55, and a wire may be provided to connect the negative side of the battery 55 to the module.

Figure 15:
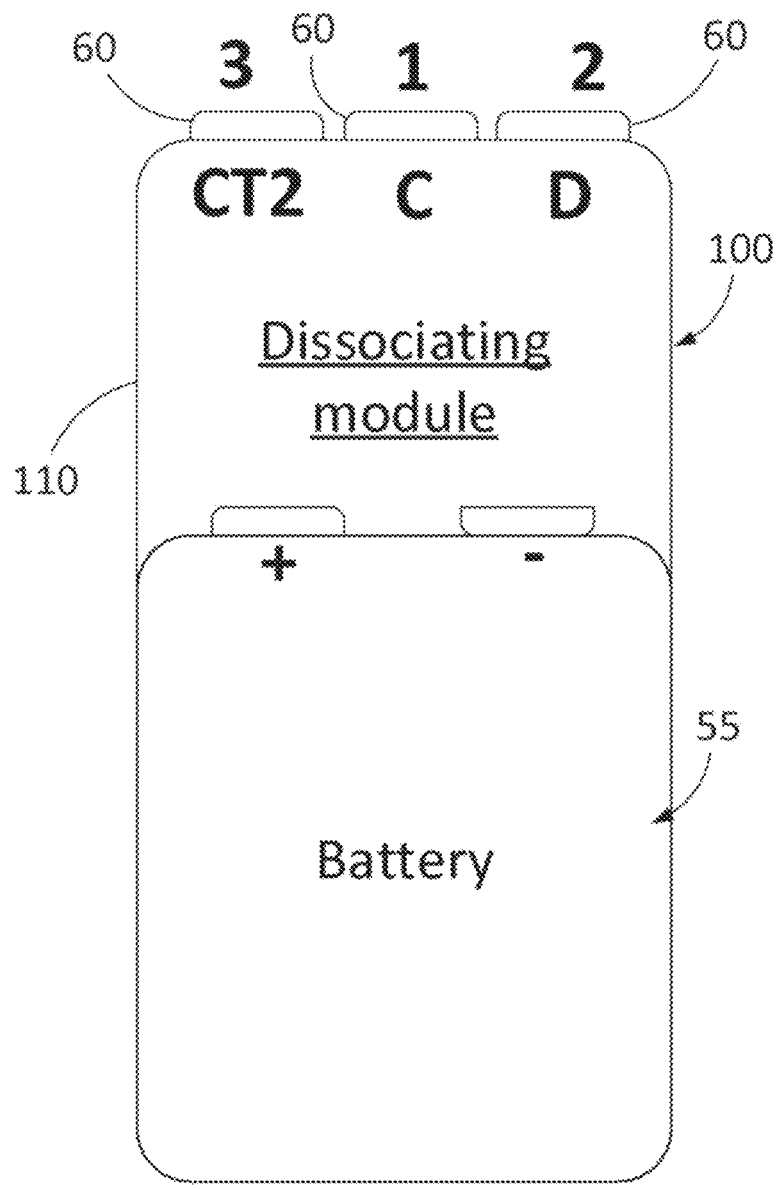
FIG. 15 is a diagram illustrating a dissociating module installed on a battery, according to an embodiment.

FIG. 15 illustrates an embodiment of how a dissociating module 100 can be implemented in practice. Indeed, the dissociating module 100 comprises an enclosure or body 110 that covers or hides at least one of the studs of the battery 55. In FIG. 15, the enclosure or body 110 covers both studs of the battery 55. It can offer two, three, or any other number of studs for electrical connection. In FIG. 15, the body 110 is shown considering the dissociating module 100 of FIG. 8, i.e., the body 110 has three module circuit connectors 60 labeled as 1, 2 and 3 which are available to the user for connection. The body could also have two module circuit connectors 60 as in the dissociating modules 100 of FIG. 4 or 6, or could have more connectors, for example direct electric connections to the + and − poles of the battery. Providing the dissociating module 100 with a body 110 that covers the battery 55 offers a user-friendly solution for non-professionals who wish to install a system 10 in a residential local electric network with the ease usually found in consumer products. The body 110 is of a versatile shape that allows installation on a variety of battery types or brands, to alternatively install on a load 20 if needed, or to alternatively install on another dissociating module 100 or 200 if needed. This enforces the modular nature of the system since a plurality of dissociating modules 100 can be installed on a plurality of different components or objects in a circuit and work as intended despite the numerous differences between these components or objects. Furthermore, if the body 110 covers the studs of the battery, no connection to the original studs is allowed (only to the new studs as shown in FIG. 15), and therefore, any fuse 920 provided within the dissociating module 100 will be mandatory if the battery 55 is connected to the circuit, because the battery 55 must be connected through the dissociating module 100 which has a fuse 920 therein. According to another embodiment (not shown), the dissociating module 100 is rather built in the battery 55.

If the electrical current delivered by a battery bank 50 is too high for a dissociating module 100, additional modules (i.e., additional switches D) can be provided, as shown in FIG. 11. FIG. 11 further shows other variants in which the system can be embodied. For example, the system 10 is shown without any input managing module 300, with a different number of batteries 55 than in FIG. 9 and with only two DC loads. All these variants are independent one from the other and can thus be implemented regardless of the implementation of other variants. The system 10 illustrated in FIG. 11 cannot provide the same advantages as the system illustrated in FIG. 9 (which is more complete), but nonetheless, basic functions (monitoring and dissociating) can be performed.

The examples and embodiments described above showed that modules can together exhibit some form of intelligence (in the sense of decision-making based on the collected data). For example, battery banks 50 can be charged independently according to their own charging algorithms. Offloading may be performed under some conditions. Simultaneous use (i.e., discharge) of battery banks 50 is performed only if some specific conditions are met. Other types of decision-making, not described above, can be performed by the modules. For example, if a given battery is in a maintenance mode (i.e., trickle charging) and would be ready for a capacity test, the capacity test may be delayed if it is determined that other battery banks 50 are being used at a high rate and the given battery bank 50 will be needed soon to feed the loads.

Collective data input by the various modules and their communication are thus needed. Decision-making can be performed by distributed (decentralized) intelligence between the modules to keep the advantage of having a modular system 10. However, a "main module" with central intelligence and decision-making can also be provided, although the user should be aware not to throw away or displace this main module. According to another embodiment, data can be sent to a server, the cloud, or other remote computing facility for decision-making; the instructions are then sent back to the modules which can apply them.

More sophisticated information can also be brought to the modular system. For example, algorithms may be implemented to recommend if or when a battery bank 50 needs to be changed by a new one. Remaining battery lifetime can be estimated. Reports of electrical consumption and generation can also be produced. Real-time charge/discharge ratios can be calculated to inform the user if the system is globally accumulating or consuming energy, and propose actions (remedies) that the user could implement, for example, if the cables are not suited for the high currents being used, a re-dimensioning of the cabling can be suggested.

According to an embodiment, data is processed by the microcontrollers 180 in the system 10. Each microcontroller 180 is a computing device comprising a memory for storing data, including program instruction, and a processor for manipulating the data, including executing the instructions. The processor is therefore in communication with the memory and with a communication port of the microcontroller 180 for receiving and sending data. The microcontroller 180 is able to identify a plan for the loading of the battery 55 depending on the exact type of battery, in coordination with the integrated charger 170 (if provided). The microcontroller 180 is able to identify that a battery 55 should be charged, or that the batteries have been unused for a long time and therefore that they should undergo a capacity test. The decision to undergo a capacity test can be compared with external data from a database, or from the cloud, on inputted from a remote computer, to determine if the batteries are to be used soon (for example, a schedule or a forecasted day of use can be entered by a user into an application, and this data is available to the microcontroller 180 to aid in decision-making).

The microcontroller 180 is also in communication with the sensors in the dissociating module 100 such as the current meter 152, the voltage meter 154 and/or the thermometer 156. Decision-making may be based on the measurements from these sensors. For example, the measurements from the sensors are used to determine that a battery needs to be recharged, that a battery is overheating, or that a battery has aged and needs to be replaced. Some values or patterns may indeed be identified from the collected data by the microcontroller 180 to assess the state of the battery 55. If the dissociating module 100 is installed on a load, the current meter 152 and/or the voltage meter 154 can be useful for the microcontroller 180 to identify a problematic situation such as a short-circuit. Regardless of the eventual problems that can arise, the measurements gathered by these sensors can be analysed by the microcontroller(s) 180 to portrait the system 10. For example, the exact values of power generation and power consumption can be assessed over an arbitrary number of heterogeneous components while using the same dissociating module 100 on every component in the system 10, which is convenient. Decisions regarding how the power is directed in the circuit between the arbitrary number of heterogeneous components while using the same dissociating module 100 on every component in the system 10; the dissociating modules 100 can make these decisions independently of any human intervention. Since the power inputted into or outputted from a battery can be controlled by the dissociating modules 100, batteries of different ages, manufacturers and technologies can be used in the same local electrical network 15.

These decisions are usually made in accordance with certain rules or recommendations regarding the component or object on which the dissociating module 100 is installed. For example, if the dissociating module 100 is installed on a battery 55, the nature (brand, type, etc.) may be entered by the user either on a user interface on the dissociating module 100 (not shown) or through an application to which the dissociating module 100 remotely connects using the microcontroller 180. If the user enters in the application that the dissociating module 100 of a given identifier is installed on a battery of brand X, model Y, then the microcontroller may remotely access a database of charging profiles and other relevant or critical data such as optimal temperature for use, degradation of battery under extreme temperatures, normal or optimal current or voltage during use, etc. Measurements from the sensors can be more usefully analyzed by the microcontroller 180 by comparing with this type of external data. The component (battery 56 or load 20) can be operated (charged, uncharged, fed with power, etc.) if the dissociating module 100 on this component decides that it can be operated in the actual circumstances.

Data is preferably exchanged between the microcontrollers 180 of various (or all) modules 100, 200, 300. This data exchange allows the prioritization of actions to be taken by the modules. This way, the dissociating modules 100 can make decisions which are consistent, thereby avoiding any conflict (e.g., one module discharging its battery to recharge another one at the same time). Some predefined rules may be implemented in all modules to perform the prioritization of actions to be taken. A dissociating module 100 may therefore act because its action is prioritized, and all other modules will know that this given dissociating module 100 is the one that will act first because they have access to the same data and have the same rules implemented therein.

The modular aspect of the system is advantageous since it can be provided at a cost which is approximately proportional to the size of the local electrical network. Large numbers of batteries can also be accommodated by simply installing as many modules thereon. Unimportant loads 20 may not require a dissociating module, which illustrate the modularity of the system means it is adaptable to many situations. Dissociating modules can also be easily transported (for example by armed forces which can transport individual batteries that will be connected together later on). Modules can even be used on batteries being stocked for long periods.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A system for monitoring and controlling components of an electric circuit, the components comprising batteries, the system comprising dissociating modules, each one of the dissociating modules for mechanical and electrical connection to a component from the components being monitored, wherein one of the dissociating modules is on a given battery, each one of the dissociating modules comprising:
   a first circuit connector and a second circuit connector for electrically connecting to the electric circuit, at least one of the first circuit connector and the second circuit connector being for electrical connection to a source of electrical power;
   component connectors for electrically connecting with poles of one of the components of the electric circuit and providing an interface for mechanical installation with the components which is usable with any one of a battery and a load to allow reinstallation of the dissociating module on another component;
   a first switch associated to the first circuit connector and a second switch associated to the second circuit connector, the first switch being on an electrical path between the first circuit connector and the component connectors, the second switch being on an electrical path between the second circuit connector and the component connectors, one of the first switch and the second switch being closable for allowing current input from the source of electrical power into one of the component connectors, the other one of the first switch and the second switch being closable for allowing current output from one of the component connectors to the electric circuit;
   sensors for performing measurements in the dissociating module;
   a computing device in communication with the sensors and with the first switch and the second switch for opening and closing the first switch and the second switch based on the measurements from the sensors, thereby configuring the switches to operate the component or not; and
   a third circuit connector for electrically connecting with an external capacity-test load through the electric circuit, the third circuit connector having a capacity-test switch,
   wherein the computing devices of the dissociating modules are in communication together to instruct the isolation of each battery that is susceptible to drain the batteries in parallel therefrom, thereby allowing the system to be used on an electric circuit comprising a concurring plurality of batteries having different electrical properties without damaging any one of the plurality of batteries,
wherein the computing device executes instructions to determine, based on the measurements from the sensors, that the given battery on which said one of the dissociating modules is installed can be discharged to undergo a capacity test, wherein the computing device configures the first switch, the second switch, and the capacity-test switch for the capacity test and communicates with the computing devices of other dissociating modules in series with the given battery to have them bypassed, thereby outputting current from the given battery into at least one load, wherein the computing device collects measurements from the sensors during discharging for characterizing the given battery.

2. The system of claim 1, wherein the electric circuit comprises batteries connected in series, the system comprising dissociating modules installed on the batteries connected in series, wherein each one of the dissociating modules comprise a bypass switch, in communication with the computing device of a respective one of the dissociating modules, which is closable by the computing device to allow current to flow through the dissociating module while preventing current to flow through at least one of the batteries connected in series, thereby allowing the current to flow through the dissociating modules installed on the batteries connected in series while dissociating the at least one of the batteries connected in series.

3. The system of claim 2, wherein the bypass switch connects the second circuit connector to one of the component connectors.

4. The system of claim 1, wherein the system further comprises an input managing module in communication with the dissociating modules via the computing device, the input managing module managing input of electric power from power sources into the electrical circuit.

5. The system of claim 4, wherein the computing device executes instructions to determine, based on the measurements from the sensors, that the given battery on which the dissociating module is installed needs to be charged, wherein the computing device communicates with:
the computing devices of other dissociating modules so that all dissociating modules in series with the given battery are bypassed and the dissociating modules in parallel with the given battery block current;
wherein the computing device configures the first switch and the second switch to direct inputted current from at least one of the power sources into the given battery for recharging.

6. The system of claim 5, wherein the computing device executes instructions to direct the inputted current from the at least one of the power sources into the given battery for recharging according to a given profile optimized for the recharging of the given battery.

7. The system of claim 1, wherein the capacity-test switch is in communication with the computing device, which is closable by the computing device to allow connection between the external capacity-test load and the given battery on which the dissociating module is installed so that the given battery can discharge into the external capacity-test load while being monitored by the sensors in the dissociating module.

8. The system of claim 1, wherein the computing device of each one of the dissociating modules comprises a communication unit to exchange data, the computing device of each one of the dissociating modules being adapted to make decisions according to a common set of rules to avoid any conflict between dissociating modules, thereby allowing the system to work regardless of a number of dissociating modules.

9. The system of claim 1, wherein the computing device is connected to a network for inputting or outputting data used in decision-making for opening and closing switches.

10. The system of claim 1, wherein the sensors comprise at least one of a current meter, a voltage meter and a thermometer.

11. The system of claim 1, wherein each one of the dissociating modules comprises an electronic fuse in connection with the component for cutting current if the current is too high.

12. The system of claim 11, wherein one of the dissociating modules comprises a body having a shape adapted to cover at least one stud of the given battery and to prevent outside connection to the at least one stud of the given battery if the dissociating module is installed on the given battery, thereby making the electronic fuse mandatory when the given battery is connected to a circuit.

13. The system of claim 1, further comprising an integrated charger for ensuring that charging of the given battery is substantially performed according to a charging profile.

14. A system for monitoring and controlling components of an electric circuit, the components comprising batteries, the system comprising dissociating modules, each one of the dissociating modules for mechanical and electrical connection to a given battery from the components being monitored, wherein one of the dissociating modules is on a given battery, each one of the dissociating modules comprising:
a first circuit connector and a second circuit connector for electrically connecting to the electric circuit, at least one of the first circuit connector and the second circuit connector being for electrical connection to a source of electrical power;
component connectors for electrically connecting with poles of one of the components of the electric circuit and providing an interface for mechanical installation with the components which is usable with any one of a battery and a load to allow reinstallation of the dissociating module on another component;
a first switch associated to the first circuit connector and a second switch associated to the second circuit connector, the first switch being on an electrical path between the first circuit connector and the component connectors, the second switch being on an electrical path between the second circuit connector and the component connectors, one of the first switch and the second switch being closable for allowing current input from the source of electrical power into one of the component connectors, the other one of the first switch and the second switch being closable for allowing current output from one of the component connectors to the electric circuit;
sensors for performing measurements in the dissociating module;
a computing device in communication with the sensors and with the first switch and the second switch for opening and closing the first switch and the second switch based on the measurements from the sensors, thereby configuring the switches to operate the component or not
wherein the computing devices of the dissociating modules are in communication together to instruct the isolation of each battery that is susceptible to drain the batteries in parallel therefrom, thereby allowing the system to be used on an electric circuit comprising a concurring plurality of batteries having different electrical properties without damaging any one of the plurality of batteries, wherein the electric circuit comprises batteries connected in series, the system comprising dissociating modules installed on the batteries connected in series, wherein each one of the dissociating modules comprise a bypass switch, in communication with the computing device of a respective one of the dissociating modules, which is closable by the computing device to allow current to flow through the dissociating module while preventing current to flow through at least one of the batteries connected in series, thereby allowing the current to flow through the dissociating modules installed on the batteries connected in series while dissociating the at least one of the batteries connected in series.

15. The system of claim 14, wherein the bypass switch connects the second circuit connector to one of the component connectors.

16. The system of claim 14, wherein the system further comprises an input managing module in communication with the dissociating modules via the computing device, the input managing module managing input of electric power from power sources into the electrical circuit.

17. The system of claim 16, wherein the computing device executes instructions to determine, based on the measurements from the sensors, that the given battery on which the dissociating module is installed needs to be charged, wherein the computing device communicates with:

the computing devices of other dissociating modules so that all dissociating modules in series with the given battery are bypassed and the dissociating modules in parallel with the given battery block current;

wherein the computing device configures the first switch and the second switch to direct inputted current from at least one of the power sources into the given battery for recharging.

18. The system of claim 17, wherein the computing device executes instructions to direct the inputted current from the at least one of the power sources into the given battery for recharging according to a given profile optimized for the recharging of the given battery.

19. The system of claim 14, wherein each one of the dissociating modules comprises an electronic fuse in connection with the component for cutting current if the current is too high, wherein one of the dissociating modules comprises a body having a shape adapted to cover at least one stud of the given battery and to prevent outside connection to the at least one stud of the given battery if the dissociating module is installed on the given battery, thereby making the electronic fuse mandatory when the given battery is connected to a circuit.

20. The system of claim 14, wherein the computing device executes instructions to determine, when communicating with the computing devices of other dissociating modules, that other batteries are insufficient for feeding at least one load and that its given battery can deliver power, wherein the computing device configures the first switch and the second switch and communicates with:

the computing devices of other dissociating modules in series with the given battery to have them delivering power or bypassed.

* * * * *